(12) United States Patent
Matsui

(10) Patent No.: US 9,048,618 B2
(45) Date of Patent: Jun. 2, 2015

(54) SHORT GAIN CAVITY DISTRIBUTED BRAGG REFLECTOR LASER

(71) Applicant: FINISAR CORPORATION, Sunnyvale, CA (US)

(72) Inventor: Yasuhiro Matsui, Milpitas, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 13/795,384

(22) Filed: Mar. 12, 2013

(65) Prior Publication Data
US 2014/0269807 A1 Sep. 18, 2014

(51) Int. Cl.
*H01S 3/08* (2006.01)
*H01S 5/0625* (2006.01)
*H01S 5/028* (2006.01)
*H01S 5/042* (2006.01)
*H01S 5/10* (2006.01)
*H01S 5/12* (2006.01)

(52) U.S. Cl.
CPC .......... *H01S 5/06256* (2013.01); *H01S 5/0287* (2013.01); *H01S 5/0425* (2013.01); *H01S 5/06251* (2013.01); *H01S 5/1039* (2013.01); *H01S 5/1221* (2013.01)

(58) Field of Classification Search
USPC .......................... 372/99, 50.11, 43.01, 4, 102
See application file for complete search history.

(56) References Cited

U.S. PATENT DOCUMENTS

| | | | | |
|---|---|---|---|---|
| 5,288,659 | A | * | 2/1994 | Koch et al. ...................... 438/31 |
| 2007/0041415 | A1 | * | 2/2007 | Fujiwara et al. ............ 372/50.11 |
| 2008/0144682 | A1 | * | 6/2008 | Aoki ........................... 372/44.01 |
| 2012/0044481 | A1 | * | 2/2012 | Morimoto et al. ........... 356/73.1 |

* cited by examiner

*Primary Examiner* — Xinning Niu
*Assistant Examiner* — Vu A Vu
(74) *Attorney, Agent, or Firm* — Maschoff Brennan

(57) ABSTRACT

A long wavelength, short cavity laser can include: an active region or gain cavity having a length from about 10 microns to about 150 microns; a gap region adjacent to the active region and having a gap length that is less than 30 microns or less than the length of the active region; and a distributed Bragg reflector ("DBR") region having a grating with a kappa of at least about 200 cm$^{-1}$, wherein the gap region is between the active region and the DBR region, and wherein the laser lases at a long wavelength side of a Bragg peak of the laser. The laser can have a second DBR region opposite of the first DBR region.

24 Claims, 15 Drawing Sheets

SHORT GAIN CAVITY DISTRIBUTED BRAGG REFLECTOR LASER

BACKGROUND

In a distributed Bragg reflector (DBR) laser, a gain medium is in optical communication with one or more grating structures that define reflection peaks that control which wavelengths of light are reflected back into the gain section and amplified for output from the laser cavity. The grating structures therefore can be used to control the output spectrum of the laser. Where two grating structures are used having different free spectral ranges, the output spectrum of the laser is determined by the alignment of the reflective spectrum of the two grating structures. The alignment of the reflection spectrum may be shifted with respect to one another to accomplish a shift in the output frequency of the laser that is much larger than the frequency shift of the reflection spectrum due to the Vernier effect.

In most DBR lasers current injection is used to tune the reflection peaks of the grating structures. However, current injection tends to degrade the materials of the DBR section over time, which limits the useful life of transmitters using current injection.

In other DBR lasers the reflection spectrum is shifted by changing the temperature of the grating structures due to the thermo-optic effect. Temperature tuning does not shorten the useful life of a DBR laser to the same extent as current injection. However, prior temperature tuning systems and methods have high power requirements, slow frequency response, and narrow tuning bands.

Therefore, it can be advantageous to tune a DBR to have faster speed in a manner that does not degrade its materials or have high power requirements.

SUMMARY

In one embodiment, a laser can be configured to include: a gain cavity having a length from about 10 microns to about 150 microns; a distributed Bragg reflector ("DBR") region having a grating with a kappa of at least about 100 cm$^{-1}$; and a lasing mode at a long wavelength side of a Bragg peak of the DBR region. The lasing on long wavelength side of the Bragg peak can be obtained as a result from a detune loading effect. In one aspect, the gain cavity has a length of less than or about 50 microns and is devoid of a grating. In one aspect, a gap region can be between the gain cavity and DBR region having a gap length that is less than about 30 microns. In another aspect, a gap region can be adjacent to the gain cavity having a gap length that is less than the length of the gain cavity. In one aspect, the kappa is at least about 200 cm$^{-1}$. The laser can include a reflective facet having at least about 95% reflectivity adjacent to the gain cavity and opposite of the DBR region or include a second DBR region adjacent to the gain cavity and opposite of the first DBR region.

In one embodiment, the laser can have an open eye at about 10 Gb with 3.5 mA bias current and 4 mApp modulation current. Additionally, the laser can have one or more of the following parameters: having about 25 GHz bandwidth; power for lasing is less than about 1.5 W; modulation voltage is less than about 6 Vpp; speed of at least about 25 Gbps; a stop band width of about 5 nm; a linewidth of below about 400 KHz; a side mode suppression ratio of about 68 dB; and/or a L-I curve that is superlinear with a mode hop at about 45 mA.

In one embodiment, the present invention provides a method of designing a laser, where such a method can include: determining a gain cavity to have a length of less than or about 150 microns; determining a distributed Bragg reflector ("DBR") region to have a grating with a kappa of at least about 100 cm$^{-1}$; and determining a lasing mode at a long wavelength side of a Bragg peak of the DBR region. The method can also include configuring the lasing mode to be on the long wavelength side of the Bragg peak by utilizing the detune loading effect.

In one embodiment, the method of designing the laser can include determining the laser to have one or more of the following parameters: gain cavity has a length of less than or about 50 microns and is devoid of a grating; a gap region between the gain cavity and DBR region having a gap length that is less than about 30 microns or a gap region adjacent to the gain cavity having a gap length that is less than the length of the gain cavity; the kappa is at least about 200 cm$^{-1}$; a reflective fact having at least about 95% reflectivity adjacent to the gain cavity and opposite of the DBR region or a second DBR region adjacent to the gain cavity and opposite of the DBR region; an open eye at about 10 Gb with 3.5 mA bias current and 4 mApp modulation current; about 25 GHz bandwidth; power for lasing is less than about 1.5 W; modulation voltage is less than about 6 Vpp; speed of at least about 25 Gbps; stop band width of about 5 nm; linewidth of below about 400 KHz; side mode suppression ratio of about 68 dB; or a L-I curve that is superlinear with a mode hop at about 45 mA.

In one embodiment, the present invention can include a method of manufacturing a laser, where such a method can include: preparing a gain cavity to have a length of less than or about 150 microns; preparing a distributed Bragg reflector ("DBR") region to have a grating with a kappa of at least about 100 cm$^{-1}$; and tuning a lasing mode at a long wavelength side of a Bragg peak of the DBR region. The method can include tuning the lasing mode to be on long wavelength side of the Bragg peak by utilizing the detune loading effect.

In one embodiment, the method of manufacture can include preparing the laser to have one or more of the following parameters: gain cavity has a length of less than or about 50 microns and is devoid of a grating; a gap region between the gain cavity and DBR region having a gap length that is less than about 30 microns or a gap region adjacent to the gain cavity having a gap length that is less than the length of the gain cavity; the kappa is at least about 200 cm$^{-1}$; a reflective facet having at least about 95% reflectivity adjacent to the gain cavity and opposite of the DBR region or a second DBR region adjacent to the gain cavity and opposite of the DBR region; an open eye at about 10 Gb with 3.5 mA bias current and 4 mApp modulation current; about 25 GHz bandwidth; power for lasing is less than about 1.5 W; modulation voltage is less than about 6 Vpp; speed of at least about 25 Gbps; stop band width of about 5 nm; linewidth of below about 400 KHz; side mode suppression ratio of about 68 dB; or a L-I curve that is superlinear with a mode hop at about 45 mA.

In one embodiment, a long wavelength, short gain cavity laser can include: an active region having a length from about 10 microns to about 150 microns; a gap region adjacent to the active region and having a gap length that is less than 30 microns or less than the length of the active region; a distributed Bragg reflector ("DBR") region having a grating with a kappa of at least about 200 cm$^{-1}$, wherein the gap region is between the active region and the DBR region; a lasing mode that lases at a long wavelength side of a Bragg peak of the laser.

In one embodiment, the laser can include the DBR region having a length of greater than 150 microns, and a second DBR region adjacent to the gain cavity and opposite of the DBR region, wherein the second DBR region has a length from about 40 microns to about 120 microns and a kappa ranging from 50 cm−1 when the length is about 120 microns to about 200 cm−1 when the length is about 40 microns.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Generally, the present invention relates to distributed Bragg reflector (DBR) lasers and, more particularly, to DBR lasers having short gain cavities and DBR lasers that are tuned to lase on the long wavelength side of the DBR. A DBR laser can include a base substrate and a gain medium formed on the base substrate. A waveguide can be positioned above the base substrate in optical communication with the gain medium. The waveguide may have a grating formed therein.

Figure 1:
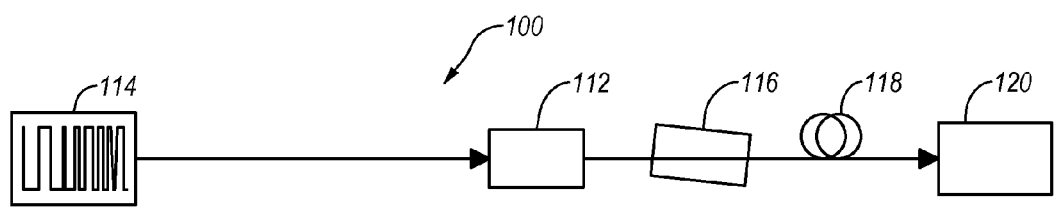
FIG. 1 illustrates a laser system suitable for use in accordance with embodiments of the present invention.

Referring to FIG. 1, a transmitter system 100 may include a distributed laser 112 coupled to a data signal source 114 that supplies a modulation signal encoding binary data. The laser 112 may be a DBR laser, distributed feed back (DFB) laser, or other laser having one or more reflectors formed using a grating formed in or adjacent to a waveguide. The output of the laser 112 may be transmitted through an optical spectrum reshaper (OSR) 116. The output of the OSR 116 may be transmitted through a fiber 118 to a receiver 120. The OSR 116 can convert a frequency modulated signal from the laser 112 to an amplitude modulated signal. In some embodiments, the output of the laser 112 is both frequency and amplitude modulated, such as adiabatically chirped pulses produced by a directly modulated DBR laser or DFB laser. The output of the OSR 116 may also remain somewhat frequency modulated.

The OSR 116 may be embodied as one or more filters, including, but not limited to, a coupled multi-cavity (CMC) filter, a periodic multi-cavity etalon, a fiber Bragg grating, a ring resonator filter or any other optical element having a wavelength-dependent loss.

In some methods of use, the laser 112 is modulated between a peak and a base frequency in order to encode a data signal in the output of the laser 112. In some embodiments the output of the laser 112 will also be modulated between peak and base amplitudes. The OSR 116 has a transmission function aligned with the base and peak frequencies such that the base frequency is attenuated more than the peak frequency in order to improve the extinction ratio of the output of the OSR 116.

Figure 2:
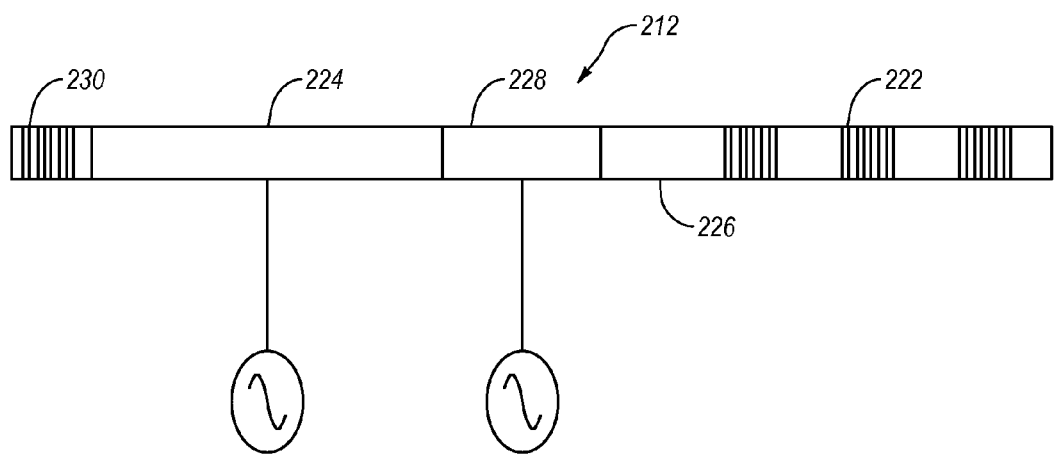
FIG. 2 illustrates a schematic representation of an embodiment of a distributed Bragg reflector (DBR) laser having a gain section and a DBR section.

Referring specifically to FIG. 2, a DBR section 222 receives light from a gain section 224. The laser 212 may include other sections such as a phase control section 226 and/or electro-absorption section 228. The gain section 224 and other sections such as the phase control section 226 and electro-absorption section 228 may be positioned between the DBR section 222 and a filter 230. In some embodiments the filter 230 may be embodied as another DBR section.

In a DBR laser, a grating structure within the DBR section 222 can define reflection peaks that control which wavelengths of light are reflected back into the gain section 224. The DBR section 222 therefore can determine the output spectrum of the laser. The reflection peaks of the DBR section 222 may be shifted by means of current injection or heating due to the thermo-optic effect in order to control the output spectrum of the laser.

Figure 3:
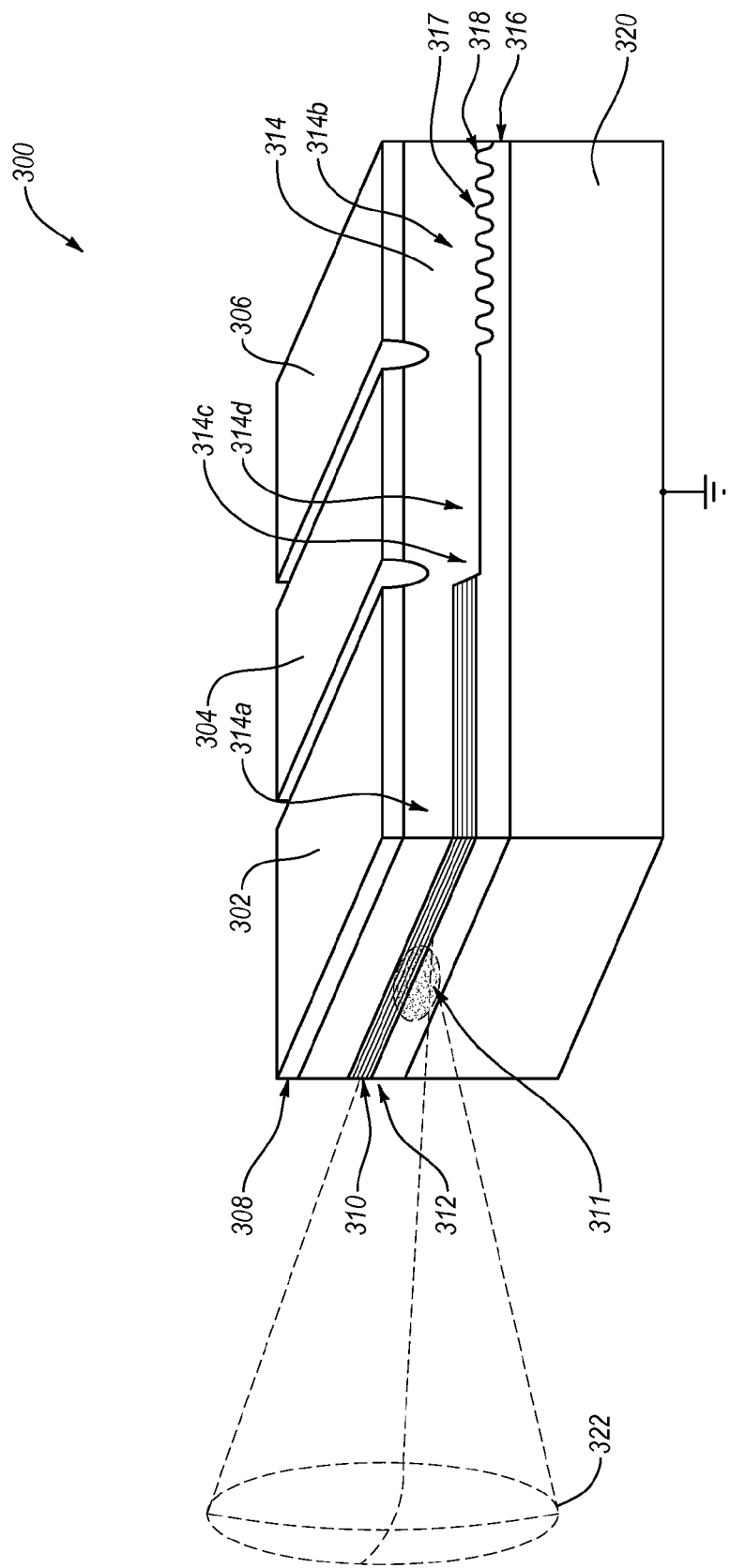
FIG. 3 illustrates an embodiment of a general DBR laser.

An example embodiment of a DBR laser 300 is depicted in FIG. 3, which emits a wavelength of about 1.3 microns. As illustrated in FIG. 3, the DBR laser 300 may include an active region 310 (i.e., gain cavity) including a multiple quantum well (MQW) region 311 and a Bragg grating region 317, which includes a distributed Bragg reflector grating 318. The MQM region 311 can include InGaAs/InGaAsP quantum wells and quantum well barriers, and optionally include transition layers between the quantum wells and quantum well barriers. The Bragg grating region 317 may be a passive region of the DBR laser 300. Also, the DBR laser 300 can include an $I_{laser}$ region 302 (e.g., having the active region 310), an $I_{phase}$ region 304 for phase tuning, and an $I_{tune}$ region 306 having the Bragg grating region 317. In some instance, such as when a fixed wavelength DBR laser 300, the $I_{phase}$ region 304 may be omitted. As shown, the DBR laser 300 can include a substrate 320 (e.g., n-doped) prepared from a suitable material, such as InP. A waveguide region 316 can be sandwiched between the substrate 320 and active region 310, where one or more other layers may intervene as known or developed in the art. For example, an etch stop layer 312 can be positioned between the waveguide region 316 and active region 310. The waveguide region 316 can be prepared from InGaAsP, and the etch stop layer 312 can be prepared from InP. The waveguide region 316 can reflect light from the Bragg grating region 317, and light out 322 can be emitted from the waveguide region 316 opposite of the Bragg grating region 317 at a wavelength of about 1.3 microns. A partially corrugated region 314 can be located over the active region 310 and waveguide region 316, which partially corrugated region 314 can have a non-corrugated portion 314a and a corrugated portion 314b that has a corrugation, such as a first order corrugation. The corrugation can have a kappa (k) as described in more detail herein. The partially corrugated region 314 can be p-doped, but may be n-doped when the substrate is p-doped. The non-corrugated portion 314a can be over or adjacent to the active region 310, and the corrugated portion 314b can be over or adjacent to the waveguide region 316. A slope transition portion 314c can be located between the non-corrugated portion 314a and corrugated portion 314b. Also, the partially corrugated region can optionally have an intermediate portion 314d that corresponds with the $I_{phase}$ region 304, if present, which intermediate portion 314d is illustrated as being non-corrugated, but it can be corrugated. Additionally, a cap layer 308 can be located over the partially corrugated region 314, which cap layer 308 can be InGaAs, and may be p doped or doped similarly to the partially corrugated region 314. The DBR laser 300 can be configured as a short gain length cavity DBR laser, which can be referred to as a short gain cavity DBR laser which indicates that the length of the gain cavity is shorter than normal for DBR lasers.

While not shown, the DBR laser 300 can include a facet with a reflective coating (e.g., anti-reflective or high reflective) or second Bragg grating region opposite of the illustrated Bragg grating region 317 as known in the art, where the second Bragg grating region can be configured for emitting light therefrom. As such, the second Bragg grating region can replace a laser facet reflective coating. In some instance, the laser facet can be highly reflective. In other instances, the laser facet can be low reflective or anti-reflective compared to the first Bragg grating region.

In one embodiment, the DBR laser 300 depicted in FIG. 3 may be configured with a reach of up to about 25 kilometers (km) or more at a data rate of up to about 10 gigabits per second (G) or more. In contrast, the more standard 10 G (distributed feedback) DFB lasers typically used for DML applications may be limited to about 5-10 km.

In one embodiment, the DBR laser can be configured as a high speed DBR laser. Such a laser can be designed for extremely low power consumption laser diode transmitters, such as for 1310 nm DFB lasers that can be used for short reach applications.

In one embodiment, the DBR laser can be configured for DQPSK by direct modulation of the laser.

In one embodiment, the DBR laser can have a wavelength of about 1310 nm or even longer, such as about 1550 nm.

The DBR laser can include a short gain cavity length that is designed to have cavity mode spacing to be narrower than the stop-band width of the DBR. As such, the DBR laser can be tuned such that the lasing mode is to the long wavelength side or frank of Bragg reflector peak without causing a mode hop. When the lasing mode is tuned to the long wavelength side of Bragg reflector peak, and the gain section is directly modulated, the resultant adiabatic chirp component can be translated into dynamic mirror loss change through the FM-mirror loss conversion in the Bragg reflector, which can result in the enhancement of effective differential gain or dynamic reduction of cavity loss. The configuration that provides the lasing mode on the long wavelength side of the Bragg reflector peak results in a functionality that provides an effect that is known as "detune loading effect". This detune loading effect can be favorably utilized in the embodiment of the short gain cavity DBR laser described herein.

The short gain cavity DBR laser now can have an extremely high-speed modulation bandwidth of up to, equal to, and possibly higher than 25 GHz, which as has been demonstrated experimentally. Greater than 25 GHz can be possible with optimization of the short gain cavity length, length of the DBR reflector region, gap, kappa, or other parameter described herein. Additionally, a sub-mA threshold current at room temperature can now be obtained for the short gain cavity DBR laser, such as with a gain length of about 50 microns or within about +/−5, +/−10, or +/−15 microns thereof. The short gain length of the DBR laser can also increase the FM efficiency of the laser diodes to about 35 GHz/2 Vpp. This enables the short gain cavity DBR laser to use only about 0.3 Vpp modulation for about 10 Gb CML applications that can have about 6 GHz of chirp, or about 1.2 Vpp modulation of about 14 Gbaud DQPSK that can have about 20 GHz chirp. Other variations and optimizations can be achieved with the parameters described herein.

Figure 7:
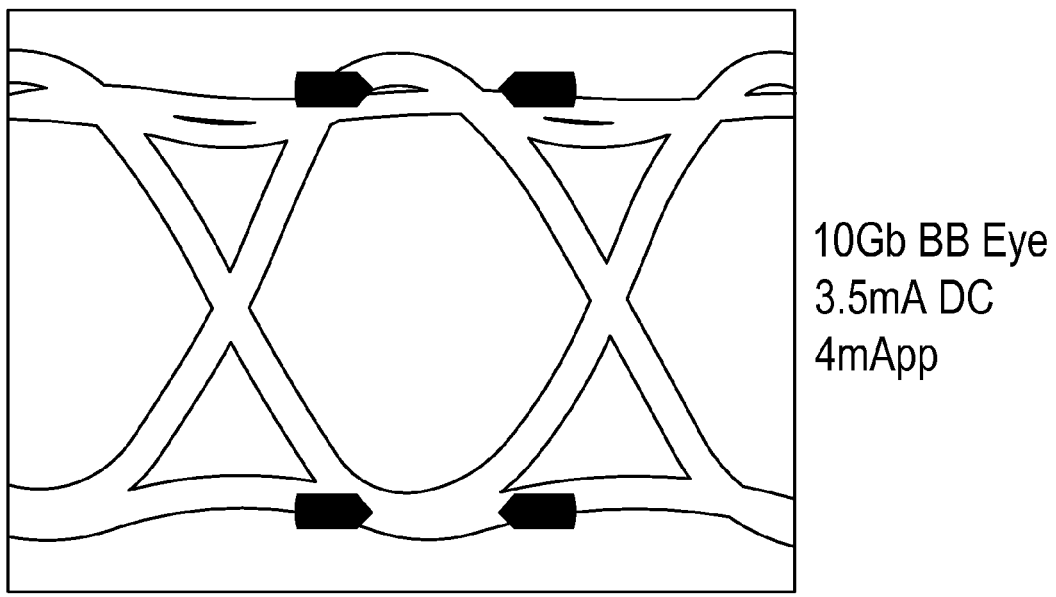
FIG. 7 illustrates back-to-back (BB) eye data for the short cavity DBR laser of FIG. 4A at 10 Gb, 3.5 mA DC, and 4 mApp.

Also, the short gain cavity DBR laser can result in a clear open eye, such as which was experimentally obtained at about 4 mA bias current with a modulation current of about 3.5 mApp for direct modulation at 10 Gb as described herein (FIG. 7). The enhancement in effective differential gain of the short gain cavity DBR laser can optimally reduce the linewidth to below about 100 KHz, as shown by simulation. The experimental short gain cavity DBR laser included the following parameters: gain length of about 50 microns; DBR reflector length of about 200 microns; and a corrugated kappa of about 100 cm$^{-1}$, which DBR laser can correlate to a stop band width of about 5 nm with cavity mode spacing of about 4.5 nm.

Figure 9A:
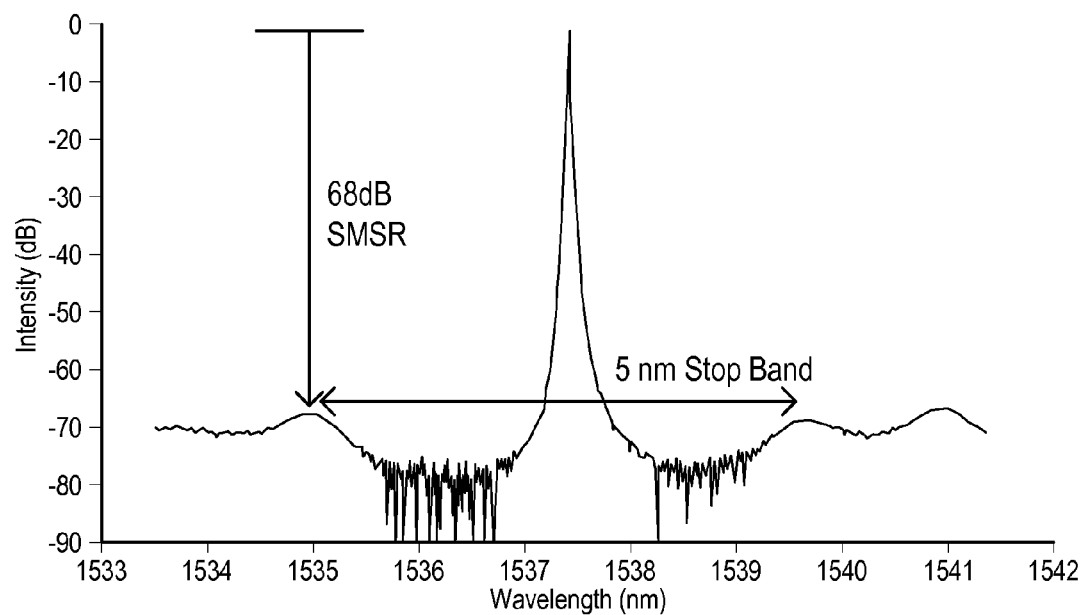
FIG. 9A illustrates a graph showing the intensity verses wavelength data for the short cavity DBR laser of FIG. 4A.
Figure 9B:
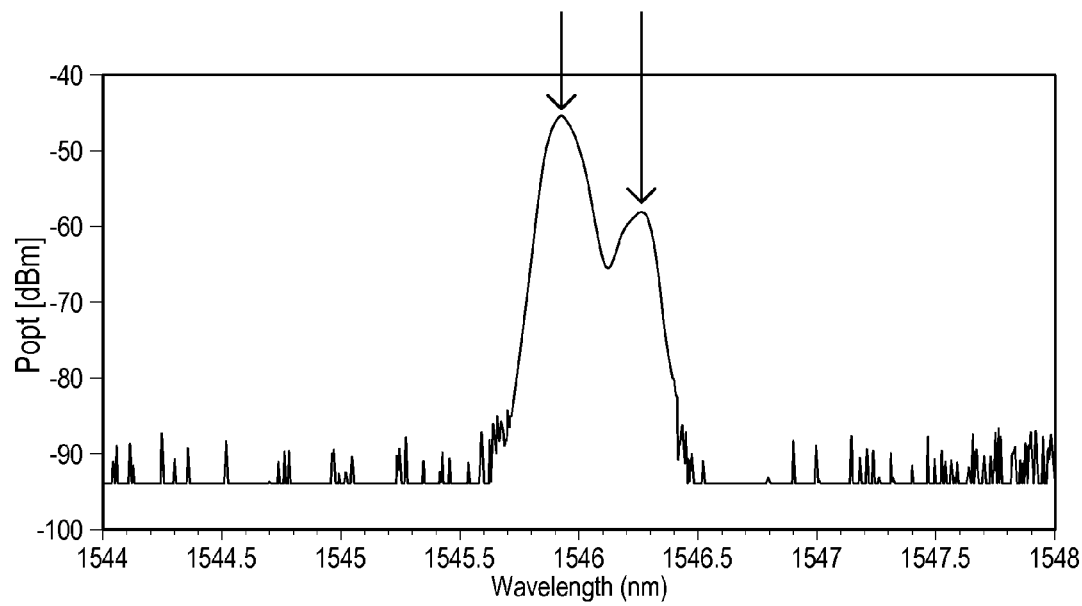
FIG. 9B illustrates a graph showing Popt verses wavelength data for the short cavity DBR laser of FIG. 4A.

The short grain cavity DBR laser only has one mode within the stop-band of the Bragg reflector as described herein (FIGS. 9A-9B). Additionally, the short gain cavity DBR laser has an extremely high SMSR of about 68 dB, which was obtained due to that fact that there is only one cavity mode within the Bragg reflector and Bragg reflector peak. At the spectrum of FIG. 9A, there is a main signal peak in the middle and then on both sides there is a very weak, small shoulder, which shows about 5 nm stop band. The 5 nm stop band is wider than traditional DBR laser. Since kappa (k) was only 100 cm$^{-1}$, larger stop band can be obtained with higher kappa.

The Bragg reflector can have reflectivity should be higher than 90, such as about 95%-99%.

While the short gain cavity is 50 nm, the penetration into the Bragg reflector can be about 30 microns, which can combine to have an effective gain cavity length of about 80 nm (without considering dimension of optional gap). This can be used to determine the cavity modal spacing. For example, FP laser can have multi-mode determined by the cavity length. In this short gain cavity DBR laser, the effective cavity length is 80 microns (e.g., very short), so the modal spacing in the spectrum is wide (e.g., 5 nm). For a common long gain cavity DBR laser, 1 nm modal spacing is often obtained for a 300 micron effective cavity length. As such, the common long gain cavity DBR laser can have 6 times the modal spacing compared to the short gain cavity DBR laser of the present invention. As such, when the short gain cavity DBR laser can include loading in the middle, the neighboring mode is 6 nm away on the right side and another mode on the left is also 6 nm away, which is completely outside of the stop band. There is no side mode within these Bragg peaks, and thereby side mode separation is high. As shown in FIG. 9A, the side mode separation ratio (SMSR) can be at least about 68 dB, but likely higher with optimization of the parameters described herein.

Figure 8:
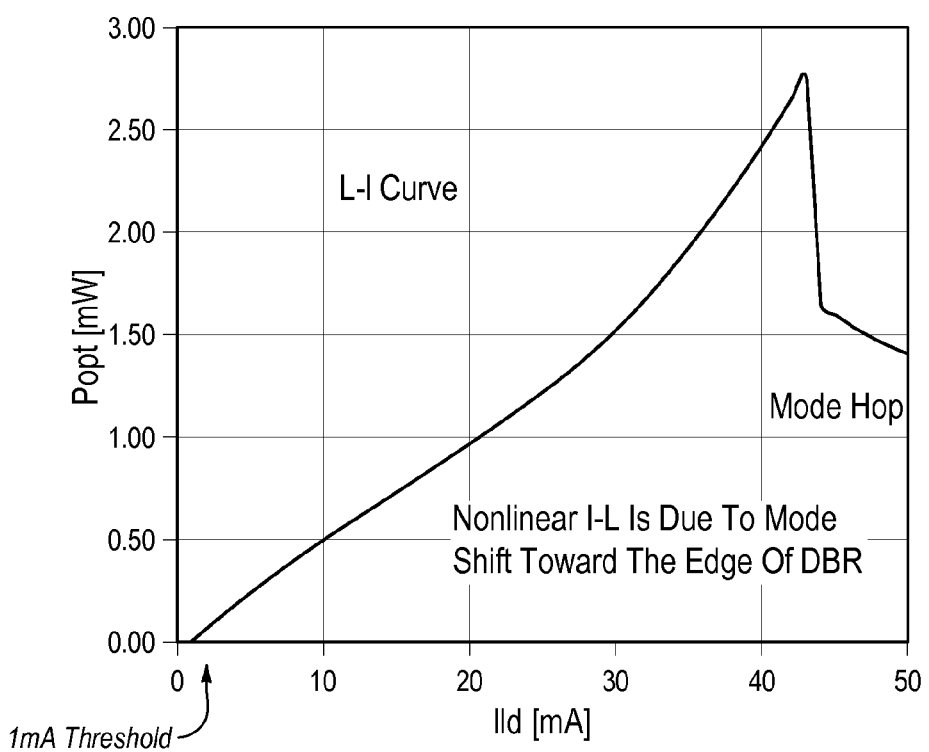
FIG. 8 illustrates a graph having L-I curve data for the short cavity DBR laser of FIG. 4A.

Moreover, the L-I curve shows that the threshold is below 1 mA (FIG. 8), where the L-I curve shows super-linear behavior on the right side before the mode hop at 45 mA bias. This is because the lasing position moves toward the long wavelength side of the Bragg peak with proper tuning using the detuned loading effect. Also, it can be possibly due to Joule heating associated with bias current where the transmission increases. Due to the short gain cavity, the bias can be lower. As the bias increases, the output power is increased with superlinear behavior due to the output power saturating with increased bias. As shown in FIG. 9, at around 45 mA there is a sudden drop, which shows the mode hop.

Figure 10A:
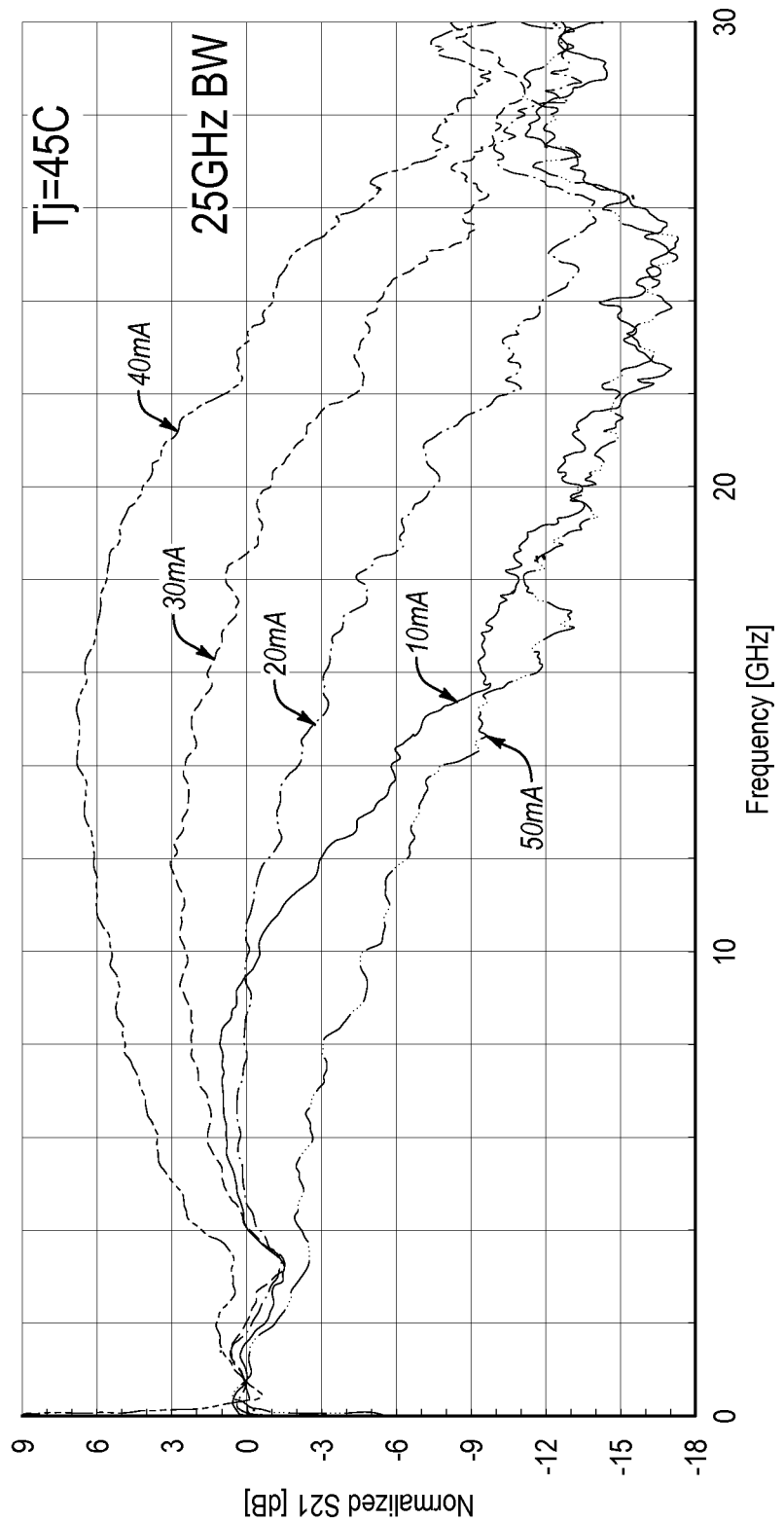
FIG. 10A illustrates a graph showing the normalized S21 (dB) verses frequency (GHz) data for the short cavity DBR laser of FIG. 4A.

The data for the short gain cavity DBR laser includes a S21 response spectrum shows 25 GHz BW was achieved right before mode hop at 45 mA (FIG. 10A). In the inset of FIG. 10A, which is shown as the FIG. 10B spectrum, it can be seen that mode is lasing at the long wavelength side of the Bragg peak near about 15 GHz, and then slowly rolls off for higher frequencies. Such slow roll-off is not characteristic to conventional DML lasers, and is considered to be due to conversion of FM modulation into AM modulation through the frank of the Bragg reflector or Bragg mirror by the detune loading effect. Moreover, simulation of linewidth of short-cavity DBR laser showing 400 KHz for the design tested in the experiment. By using longer DBR section to achieve sharp edge of Bragg reflection, simulation shows that 100 KHz linewidth operation is possible.

Figure 10B:
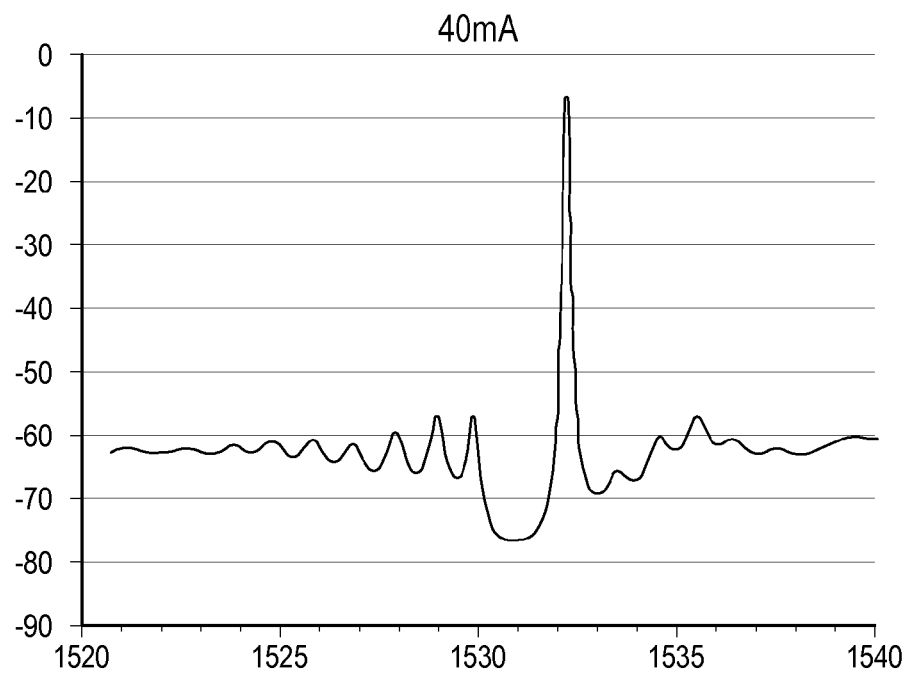
FIG. 10B illustrates a graph showing the spectrum data for the short cavity DBR laser of FIG. 4A.

FIG. 10A also shows the mode hop from 40 mA to 50 mA. This illustrates that it can be beneficial to tune the laser so that lasing occurs on the long wavelength side of the Bragg reflector. Lasing on the long wavelength side enhances speed. After the mode hop, even though bias is going up to 50, the speed is not good when have lasing on the short wavelength side of the Bragg reflector. FIG. 10B shows the detune loading effect for 40 mA, which is obtained by lasing on the long wavelength side of the Bragg reflector.

Figure 4A:
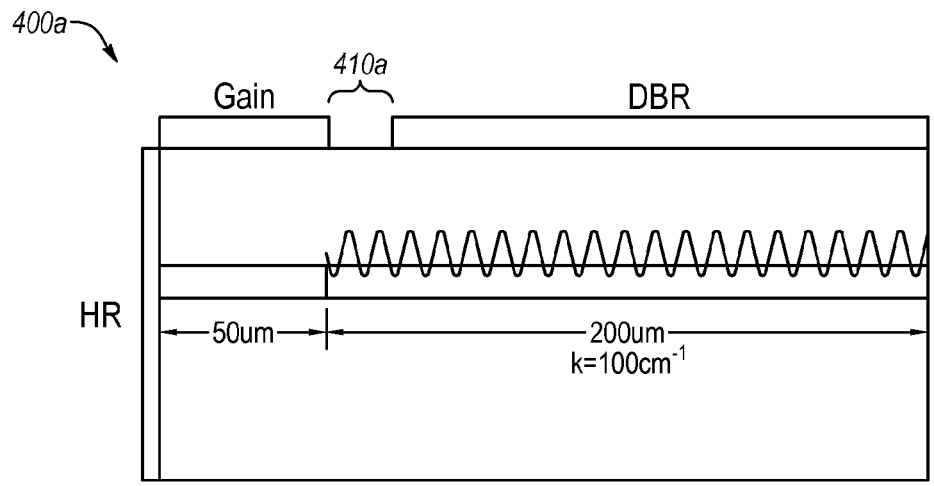
FIG. 4A illustrates an embodiment of a short gain cavity DBR laser.
Figure 4B:
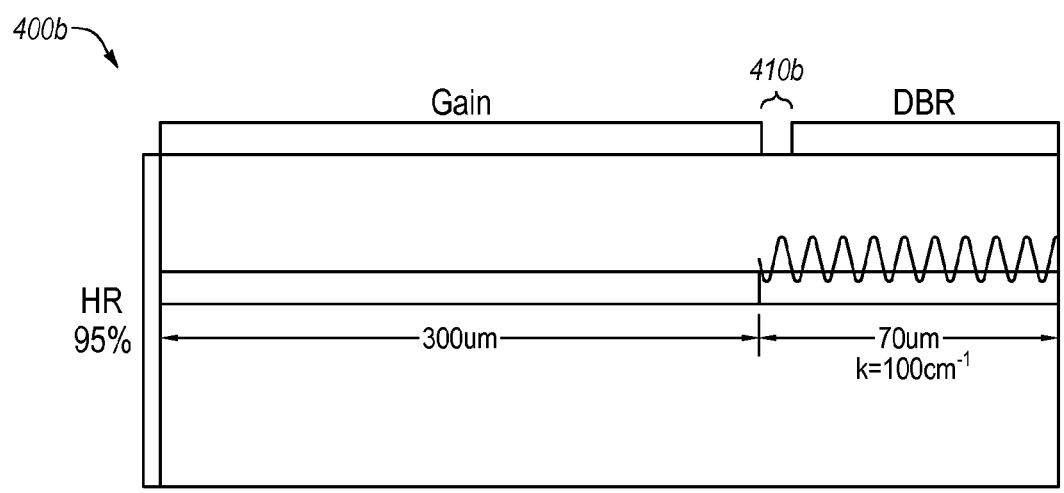
FIG. 4B illustrates an embodiment of a long gain cavity DBR laser.
Figure 5A:
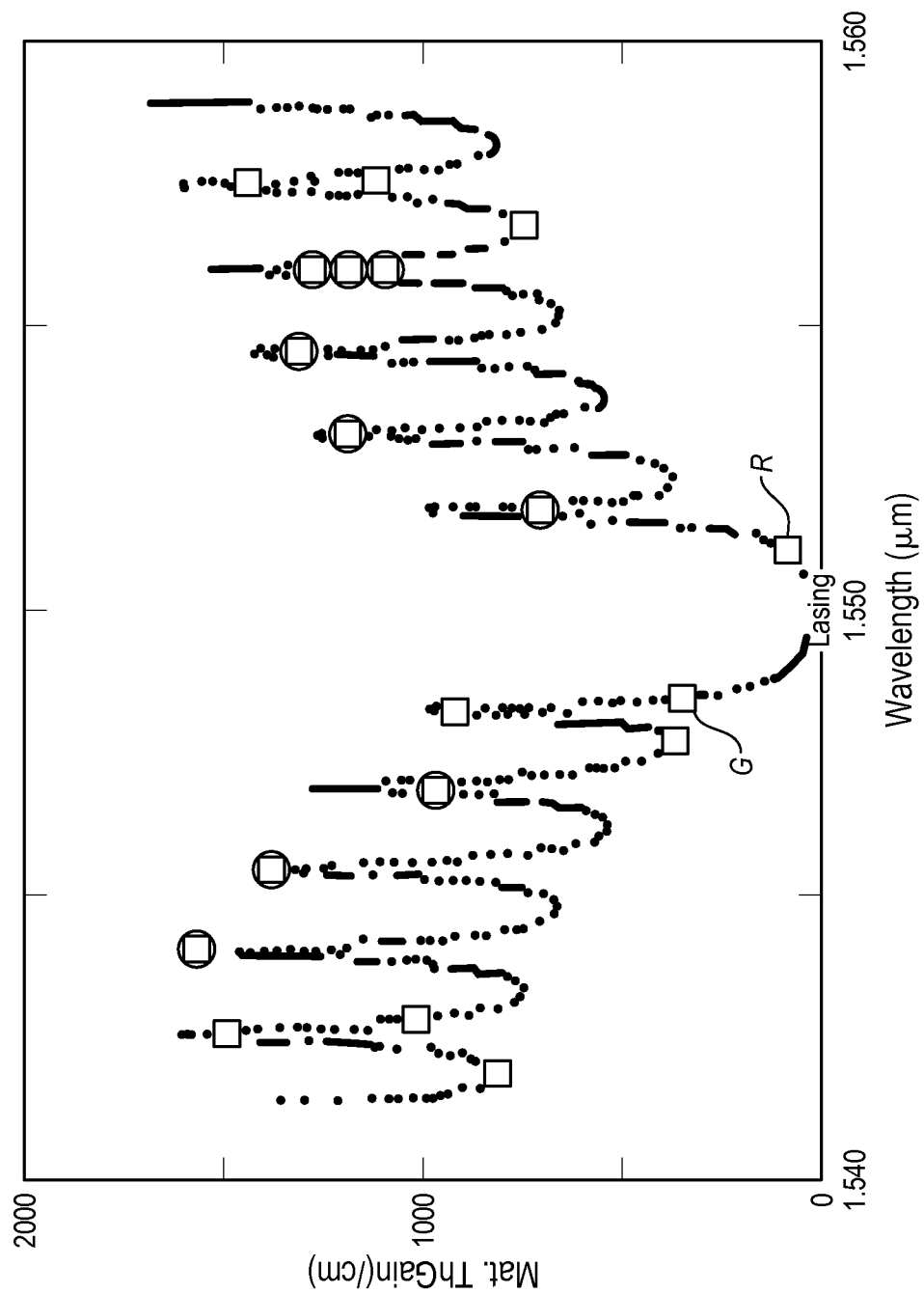
FIG. 5A illustrates a graph of lasing data for the short gain cavity DBR laser of FIG. 4A.
Figure 5B:
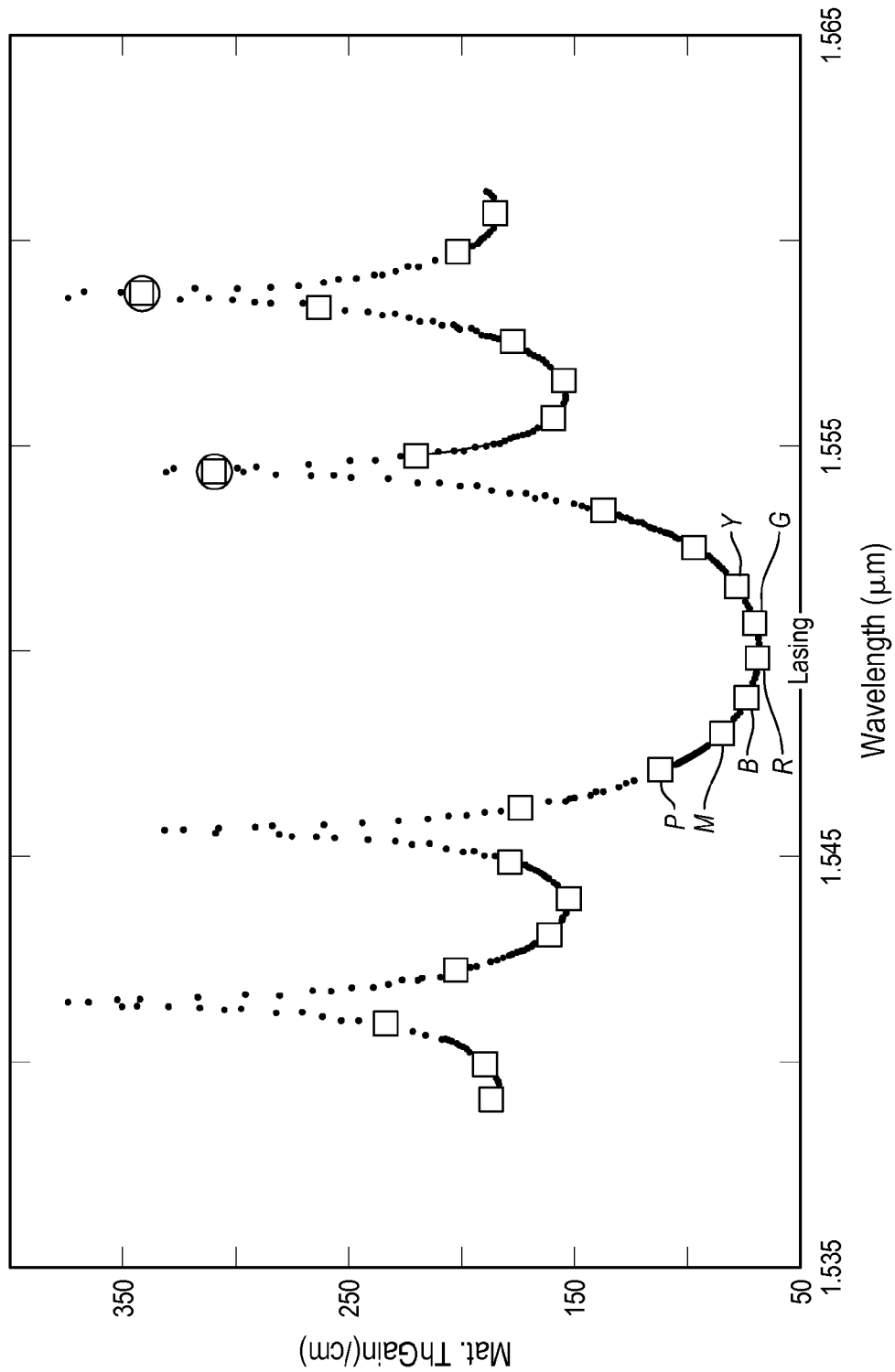
FIG. 5B illustrates a graph of data for the long gain cavity DBR laser of FIG. 4B.
Figure 6A:
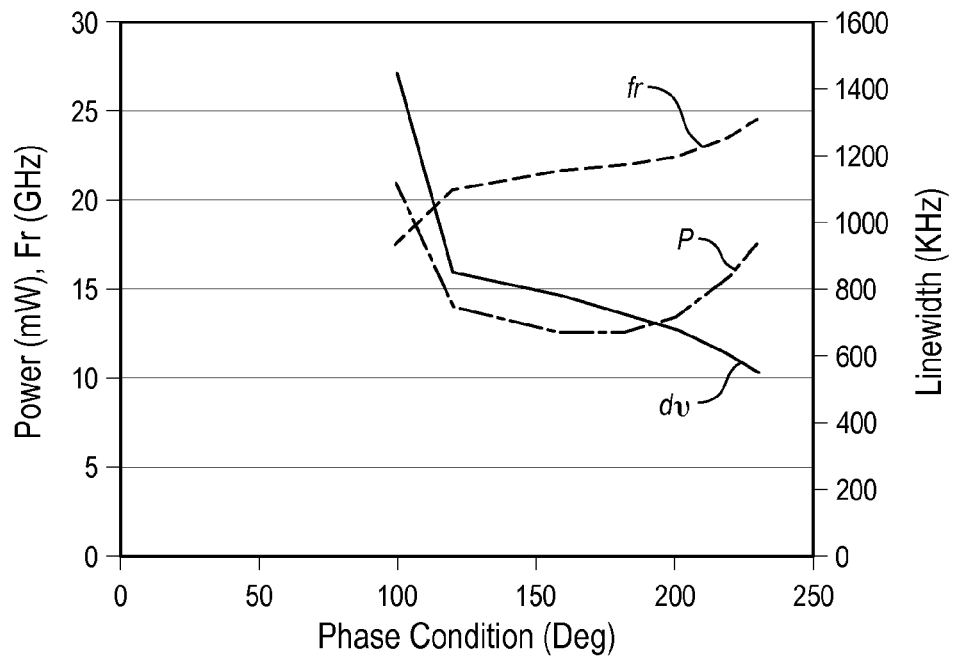
FIG. 6A illustrates a graph of data of the relevant frequency (fr), linewidth (dυ), and power (p) for the short gain cavity DBR laser of FIG. 4A.
Figure 6B:
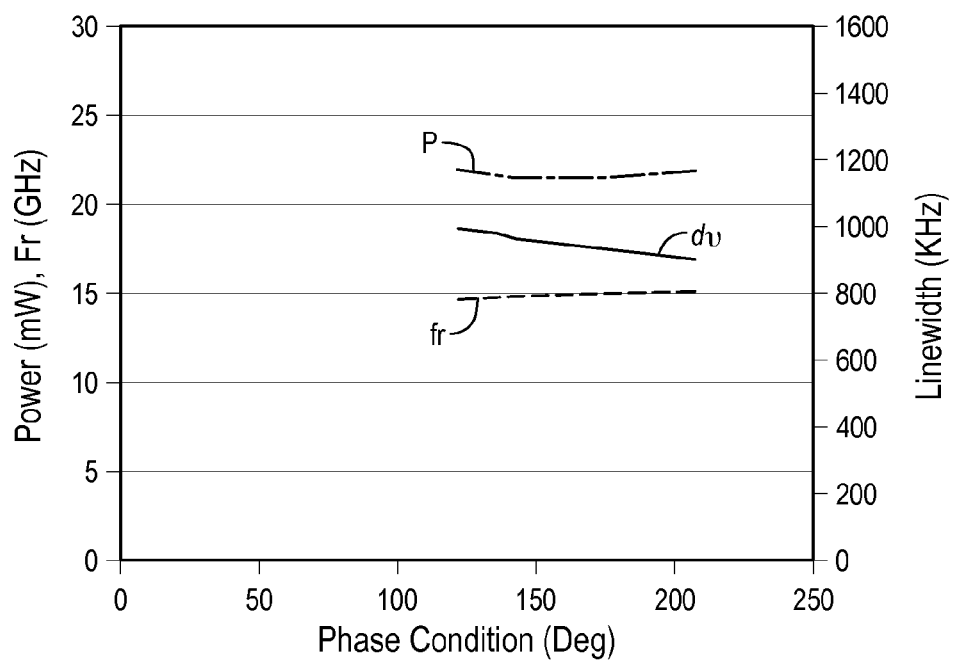
FIG. 6B illustrates a graph of data of the relevant frequency (fr), linewidth (dυ), and power (p) for the long gain cavity DBR laser of FIG. 4B.

FIG. 4A illustrates a schematic of a short gain cavity DBR laser 400a in accordance with the present invention, while FIG. 4B illustrates a schematic of a long gain cavity DBR laser 400b for comparative purposes. FIGS. 5A and 6A illustrate data for the short gain cavity DBR laser 400a of FIG. 4A, where FIGS. 5B and 6B illustrate data for the long gain cavity DBR laser 400b of FIG. 4B. As can be seen by these figures, the short gain cavity DBR laser 400a is superior to the long gain cavity DBR laser 400b.

As shown in FIG. 4A, the short gain cavity DBR laser 400a can include a short gain region of 50 microns (um), a long DBR region of 200 microns that is corrugated with a k of 100 $cm^{-1}$, and a high-reflective facet coating (HR). While shown, a gap 410a is optional between the gain and DBR regions as is known in the art.

As shown in FIG. 4B, the long gain cavity DBR laser 400b can include a long gain region of 300 microns (um), a short DBR region of 70 microns that is corrugated with a k of 100 $cm^{-1}$, and a high-reflective facet coating (HR), such as 95% reflective. While shown, a gap 410b is optional between the gain and DBR regions as is known in the art.

The kappa (k) is the value of the corrugation or grading in the DBR reflector region, where kappa describes the depth of the corrugation or grading. As such kappa provides a relative strength of the reflectance of the DBR reflector. The kappa can be described with 100 $cm^{-1}$ being relatively strong, 200 $cm^{-1}$ is strong; 300 $cm^{-1}$ is very strong, 400 $cm^{-1}$ is extremely strong, and 500 $cm^{-1}$ can be a maximum with current technologies.

The long gain cavity DBR laser 400b of FIG. 4B is a standard example, and shows a threshold gain in wavelengths of FIG. 5B that indicates that lasing happens where the threshold gain is at a minimum of the trough in the graph (e.g., lowest point). The value of the lowest data point is about 60 $cm^{-1}$, and shows about where lasing happens. Each data point in FIG. 5B indicates the position for lasing and cavity mode, which is shown to be very close together and unfavorable. On the other hand, FIG. 5A shows that the short gain cavity DBR laser 400a has lasing and cavity modes that are further apart, which provides an improvement in wavelength separation and differentiation between neighboring modes, and thereby greater side mode separation. The short gain cavity DBR laser can have side mode spacing of about 40-45 dB side mode separation ratio.

The short gain cavity DBR laser can also have improved speed. FIGS. 6A-6B show the data comparisons. In the graphs, power and linewidth are the Y axes while phase condition is the X axis. Phase condition provides a condition of the laser dot, or the main mode with respect to the Bragg reflector. The phase can be tuned. The fr is the relevant frequency, which describes the speed of the DBR laser (e.g., intrinsic speed of the DBR laser). The dυ is the linewidth. The P is power, which is the output power. The data for power indicates that the phase conditions of the DBR laser can be tuned. The data in FIG. 6B for the long gain cavity DBR laser 400b shows that fr is not highly affected and is almost flat. On the other hand, FIG. 6A for the short gain cavity DBR laser 400a shows the fr has a center region and then there is high side mode suppression ratio at both edges of this region where modal hop happens, which indicates ability to tune the phase condition to be in the middle to get an optimum or most stable condition, however, at both edges of this is where modal hop can happen.

The data of FIGS. 5A-5B and 6A-6B shows that the short gain cavity DBR laser 400a is superior to the long gain cavity DBR laser 400b. First, spacing between the cavity modes is much wider, and in the exemplary configuration there is one (or maybe two modes) on both edges of the Bragg reflector and the lower mode is the main leading mode with the next data point to the upper left being the second choice side mode. Also, the short gain cavity DBR laser 400a has a broad power, fr, and dυ. The power is the lowest in the middle, and then goes up on both edges of the Bragg reflector as the phase condition is tuned, which corresponds with the shape of the Bragg reflector peak. So, if tuned to the center of the Bragg reflector the reflectivity is highest and the power cannot come out through the Bragg reflector but is reflected. In the middle of this range is lowest because the laser is lasing in the middle of the Bragg reflector. Then the laser can be tuned to either side (e.g., to shorter wavelength side or longer wavelength side), which can be to the edge of the Bragg reflector so that the reflection is lower so the power can be higher. That explains the power having a minimum at the center and it goes up on both sides.

The fr can be tuned to the right and fr goes up, but as tuned to the left the fr goes down. This effect can be included in the detune loading effect, as described herein. As such, the intrinsic speed of the laser can be a function of the position of the Bragg reflector. When the short gain cavity DBR laser 400a speed goes up, the laser can be configured to utilize this detune loading effect to provide improvement over the standard DBR laser so that the short gain cavity DBR laser 400a is faster. Also, the opposite trend can happen for the linewidth, where tuning to the shorter wavelength side of the Bragg reflector the line width reduces, so that fr and spectral linewidth have opposite correlation or trends. This is also due to the detune loading effect on the linewidth being inverse to the speed.

Additionally, optimization of the short gain cavity DBR laser 400a design can provide maximized or optimized detune loading effect in order to make the data speed faster. At the same time, (e.g., because it's a short gain cavity) the threshold bias can be lower so that the power consumption can also be lower than conventional or long gain cavity DBR laser. The present short gain cavity DBR laser uniquely combines the short gain cavity and detune loading effect in order to obtain increased speed over conventional or long gain cavity DBR lasers. The improved speed can be obtained by tuning the laser to get lasing on the long side of the Bragg reflector.

The optimized short gain cavity DBR laser 400a can produce a spectrum of FIG. 10A-10B that shows lasing on the longer wavelength side of the Bragg reflector. As can be seen in FIG. 10B, there is a dip in the spectrum, and on the right side of this dip is a spike, which is the main mode and may be the stop band. The spike to the left of the dip is small, and thereby the main mode is on the right of the dip, which is on the long side of the Bragg reflector. This position of the lasing being on the long side of the Bragg reflector (e.g., right side) provides the detune loading effect that increases the speed of the DBR laser.

Additionally, FIG. 4A shows that there is a gap 410a between the gain and DBR, which can be important. From the electric isolation point of view, the wider gap 410a can be better because there can be higher isolation between the gain and DBR. Typically, a 30 micron gap 410a can be good, and the isolation resistance can be 2 kOhm. However, if the gap 410a is too wide, the gap 410a or DBR section may not contribute to the gain. Therefore, the large gap 410a is passive and the gain section reduced. When the gain section reduces, speed of data reduces, and thereby a smaller gap 410a can be better from a speed point of view. As such, short gap 410a sections can be advantageous of providing increased speed when the gain section is small, such as less than 75 microns, or less than or about 50 microns. When the gain section is 20 microns, then the DBR reflector effective penetration can be about 50 microns, the laser may have gain only for 20 microns and be passive for 50 microns, and the speed may not be enhanced with a weak kappa for the corrugation. However, a strong kappa can avoid deep penetration into the Bragg reflector. Also, for the same reasons, the gap 410a can be as small as possible to increase speed, but still able to provide electric isolation. For example, the gap 410a being 30 microns is too long when the gain section is 20 microns. Instead of the standard 30 micron gap 410a, the short gain cavity DBR laser can include some isolation structure such that there is 50 mega ohm. The gap 410a can be reduced to be less than 30 micron, such as about a 10 micron gap 410a that can produce about 50 mega ohm.

In one embodiment, the laser can include a distributed feedback Bragg (DFB) in the center and a DBR on both sides of the DFB, which can be referenced as a hybrid DBR/DBF/DBR laser. The detune loading effect is used on the long wavelength side of the DBR for this hybrid DBR/DBF/DBR laser as described herein in order to increase power.

In the lasers, the detune loading effect can be implemented by lasing on the long wavelength side of the Bragg reflector. A common DBR can have a peak at the center and then fall off toward the edge; and then when the gain is modulated there is some frequency shift of the lasing mode and the laser can chirp. When the DBR laser design includes the lasing on the long wavelength side of the Bragg reflector, the frequency shifts towards the peak of the Bragg reflector, which occurs dynamically and naturally. When lasing on the long wavelength side of the Bragg reflector and having frequency shift, it moves up to the peak of the Bragg reflector, which means the Bragg reflector loss is reducing. Loss of cavity is reducing because this provides a strong reflection mirror so that the photons or light cannot escape from the cavity, and thereby the photons and light is confined or contained in the gain cavity. The loss of cavity reduces dynamically, which means deduction loss that is equivalent to an increase so that gain is effectively increasing dynamically. The short gain cavity DBR laser has a deduction of loss, which translates into dynamic gain or differential gain. The increase in the differential gain increases the speed of the DBR laser.

In one embodiment, a long wavelength laser can include a short gain cavity. Such a laser can include: an active region having a length from about 10 microns to about 150 microns; optionally a gap region adjacent to the active region and having a gap length that is less than 30 microns or less than the length of the active region; a distributed Bragg reflector ("DBR") region having a grating with a kappa of at least about 200 cm$^{-1}$. The gap region can be between the active region and the DBR region. The laser can be configured so that it lases at a long wavelength side of a Bragg peak of the laser.

In one embodiment, a long wavelength laser can include a short gain cavity. Such a laser can include: a gain cavity having a length from about 10 microns to about 150 microns; optionally a gap region adjacent to the gain cavity and having a gap length that is less than 30 microns or less than the length of the gain cavity; a distributed Bragg reflector ("DBR") region having a grating with a kappa of at least about 200 cm$^{-1}$. The gap region can be between the gain cavity and the DBR region. The laser can be configured so that it lases at a long wavelength side of a Bragg peak of the laser.

The short gain cavity DBR laser that emits long wavelength laser (e.g., 1310 nm, 1550 nm, etc.) can have various configurations and still utilize the detune loading effect so that it lases on the long wavelength side of the DBR reflector. In one aspect, the laser can include a facet adjacent to a surface of the active region or gain cavity opposite of the gap region and/or DBR region. A reflective coating can be on the facet adjacent to a surface of the active region or gain cavity. The reflective coating on the facet can have 95% reflectivity. Alternatively, the reflective coating on the facet can have a reflectivity of from about 70% to about 100% reflectivity, preferably from about 75% to about 99% reflectivity, more preferably from about 80% to about 98% reflectivity, and most preferably from about 85% to about 96% reflectivity, or about 95% reflectivity.

In one embodiment, the laser can include a second DBR region adjacent to a surface of the active region or gain cavity so as to be opposite of the gap region and/or first DBR region. The second DBR region can be substantially the same as the first DBR region. However, the second DBR can be configured with less reflectivity.

In one embodiment, the active region or gain cavity can have a length from about 10 microns to about 150 microns, preferably from about 15 microns to about 100 microns, more preferably from about 20 microns to about 75 microns, even more preferably from about 25 microns to about 50 microns, or most preferably about 30 microns to 40 microns, or about 35 microns or less than 50 microns. Alternatively, the active region or gain cavity can have a length from about 10 microns to about 50 microns, preferably from about 15 microns to about 40 microns, more preferably from about 20 microns to about 35 microns, or most preferably about 25 microns to 30 microns.

In one aspect, the active region or gain cavity can be devoid of a grating. Similarly, the gap can be devoid of a grating. However, the gap may include a grating in some instances.

The active region or gain cavity can include one or more quantum wells. Any number of quantum wells that is reasonable may be used. The quantum wells may be separated by one or more quantum well barriers as known in the art. The quantum wells are prepared from traditional quantum well materials for DBR lasers or DFB lasers. The quantum well barrier layers can be prepared from traditional quantum well barrier materials for DBR lasers or DBF lasers.

In one embodiment, the gap region can have a length of less than 30 microns, preferably from about 1 micron to about 25 microns, more preferably from about 5 microns to about 20 microns, and most preferably from about 10 microns to about 15 microns. In one aspect, the gap region can have a length that is from about 10% to about 60% of the length of the active region or gain cavity, preferably from about 15% to about 50% of the length of the active region or gain cavity, more preferably from about 20% to about 40% of the length of the active region or gain cavity, and most preferably from about 25% to about 30% of the length of the active region or gain cavity.

In one aspect, the gap region can have a length that is from about 10% to about 60% of the combined length of the length of the active region or gain cavity plus the depth of penetration into the DBR, preferably from about 15% to about 50%, more preferably from about 20% to about 40%, and most preferably from about 25% to about 30% of the combined length of the length of the active region or gain cavity plus depth of penetration into the DBR.

In one embodiment, the DBR region can have a length from about 100 microns to about 300 microns, preferably from about 150 microns to about 250 microns, more preferably from about 175 microns to about 225 microns, or most preferably from about 190 microns to about 210 microns, or about 200 microns.

In one embodiment, the DBR region has a kappa from about 200 cm to about 500 $cm^{-1}$ (or higher if possible), preferably from about 250 $cm^{-1}$ to about 475 $cm^{-1}$, more preferably from about 300 $cm^{-1}$ to about 450 $cm^{-1}$, or most preferably from about 350 $cm^{-1}$ to about 325 $cm^{-1}$, or about 400 $cm^{-1}$. Up to 600 $cm^{-1}$ may be feasible and desirable. In one aspect, the DBR region has a kappa of at least about 200 $cm^{-1}$, preferably at least about 250 $cm^{-1}$, more preferably at least about 300 $cm^{-1}$, even more preferably at least about 350 $cm^{-1}$, or more preferably at least about 400 $cm^{-1}$.

In one embodiment, the DBR region can include multiple layers of at least two alternating materials with different effective refractive index, one of the two alternating materials reflecting the longer wavelength. One layer can be a short wavelength mirror, and the other can be a long wavelength mirror, which can be prepared from materials common in DBR regions.

The DBR region can have high reflectivity (e.g., reflectivity can be referred to as DBR mirror activity). The high reflectivity can be from about 85% to about 100% reflectivity, preferably from about 90% to about 99% reflectivity, more preferably from about 95% to about 99% reflectivity, and most preferably from about 98% to about 95% reflectivity, or about 99% reflectivity.

In one embodiment, the lasing mode of the short gain cavity DBR laser is tuned to the long wavelength side of a Bragg reflector produced from the laser. In one aspect, the lasing mode can be tuned by tuning the phase condition. In one aspect, the lasing can occur at edge of longer wavelength side of the Bragg reflector. In one aspect, lasing on the longer wavelength side of the Bragg reflector results in faster speed. In one aspect, the DBR laser includes a detuned loading effect with respect to lasing on the longer wavelength side of the Bragg reflector. Also, this can include detuned loading effect with respect to lasing on the longer wavelength side of the Bragg peak.

In one embodiment, the lasing mode can be tuned to the long wavelength side of the Bragg peak in order to cause an adiabatic chirp component reduces cavity loss and enhances differential gain.

In one embodiment, the DBR region can be configured for conversion of frequency modulation ("FM") to amplitude modulation ("AM") at the long wavelength side of the Bragg peak.

In one embodiment, the DBR region can be configured such that light penetrates the DBR region to a depth of 30 microns. In one embodiment, the DBR region can be configured such that light penetrates the DBR region to a depth that ranges from about 5 microns to about 30 microns, more preferably about 10 microns to about 25 microns, and most preferably from about 15 microns to about 20 microns.

In one embodiment, the length of the active region or gain cavity and depth of light penetration into the DBR region results in an effective cavity length of 80 microns, which is with or without considering length of the gap. In one aspect, the short gain cavity DBR laser has an effective cavity length ranges from about 30 microns to about 100 microns, more preferably about 50 microns to about 90, and most preferably from about 70 microns to about 80 microns.

In one embodiment, the short gain cavity DBR laser can produce an open eye at about 10 GB with about 3.5 mA bias current and about 4 mApp modulation current. In one aspect, it can have about 25 GHz bandwidth. In one aspect, the speed of the laser is at least about 25-28 Gbps. In one aspect, the power is less than or about 1.5 W, such as less than or about 1.4 W, less than or about 1.3 W, less than or about 1.25 W, less than or about 1.2 W, less than or about 1.1 W, or less than or about 1.0 W. However, these values may vary as needed or desired.

In one embodiment, the laser can include a modulator. The modulation voltage can be modulated by differential quadrature phase shift keying ("DQPSK"). In one aspect, it can have two modulator drivers and a precoder. In one aspect, the modulator can include at least one Mach-Zender (MZ) driver.

In one aspect, the modulator can include InP. The modulation voltage can be less than or about 6 Vpp.

In one embodiment, the speed of the laser ranges from about 25 Gbps to about 50 Gbps, more preferably about 26 Gbps to about 45 Gbps, and most preferably from about 28 Gbps to about 40 Gbps.

In one embodiment, the bias current can be about 5 mA. In one aspect, the bias current can range from about 2 mA to about 6 mA, preferably from about 3 mA to about 5 mA, more preferably from about 4 mA to about 4.5 mA, and most preferably about 4.25 mA.

In one embodiment, the modulation current can be about 3.5 mApp. In one aspect, the bias current can range from about 2 mApp to about 6 mApp, preferably from about 3 mApp to about 5 mApp, more preferably from about 3.25 mApp to about 4.5 mApp, and most preferably from about 3.5 mApp to about 4 mApp.

In one embodiment, the short gain cavity DBR laser can include a cavity mode spacing that is narrower than a stop-band width of the long gain cavity DBR. For example, the cavity mode spacing can be about 4.5 nm. The cavity mode spacing can result in only one cavity mode within the stop-band of the DBR region. The cavity mode spacing can range from about 2 nm to about 6 nm, from about 2.5 nm to about 5.5 nm, about 3 nm to about 5 nm, and most preferably from about 4 nm to about 4.75 nm.

In one embodiment, the stop-band width is about 5 nm. In one embodiment, the stop-band width of the DBR can range from about 2 nm to about 7 nm, from about 3 nm to about 6 nm, from about 4 nm to about 5.5 nm, and from about 4.75 nm to about 5.25 nm.

In one embodiment, the short gain cavity DBR laser can have a linewidth below 400 KHz. In one aspect, the linewidth can be at about 100 KHz. The linewidth ranges from about 50 KHz to about 300 KHz, from about 75 KHz to about 200 KHz, from about 80 KHz to about 150 kHz, and from about 90 KHz to about 125 KHz.

In one embodiment, the short gain cavity DBR laser can include a side mode suppression ratio ("SMSR") of about 68 dB. In one embodiment, the SMSR ranges from about 40 to about 80, preferably from about 45 to about 75, more preferably about 50 to about 70, and most preferably from about 60 to about 70.

In one embodiment, the short gain cavity DBR laser can include a threshold below or about 1 mA. In one aspect, the threshold is below or about 0.9 mA, preferably below or about 0.8 mA, more preferably below or about 0.75 mA, and most preferably below or about 0.7 mA. In one embodiment, the short gain cavity DBR laser produces a L-I curve that is super-linear. The L-I curve can be super-linear at a right hand side of the L-I curve. The L-I-curve can be linear to superliner to kinked at a mode hope as current is increased. An example is shown in the figures.

The foregoing parameters can apply to the laser embodiment having the short gain region with one DBR mirror opposite of a facet. However, these parameters can also be applied to the DR laser embodiment described below.

DR Laser

Figure 11:
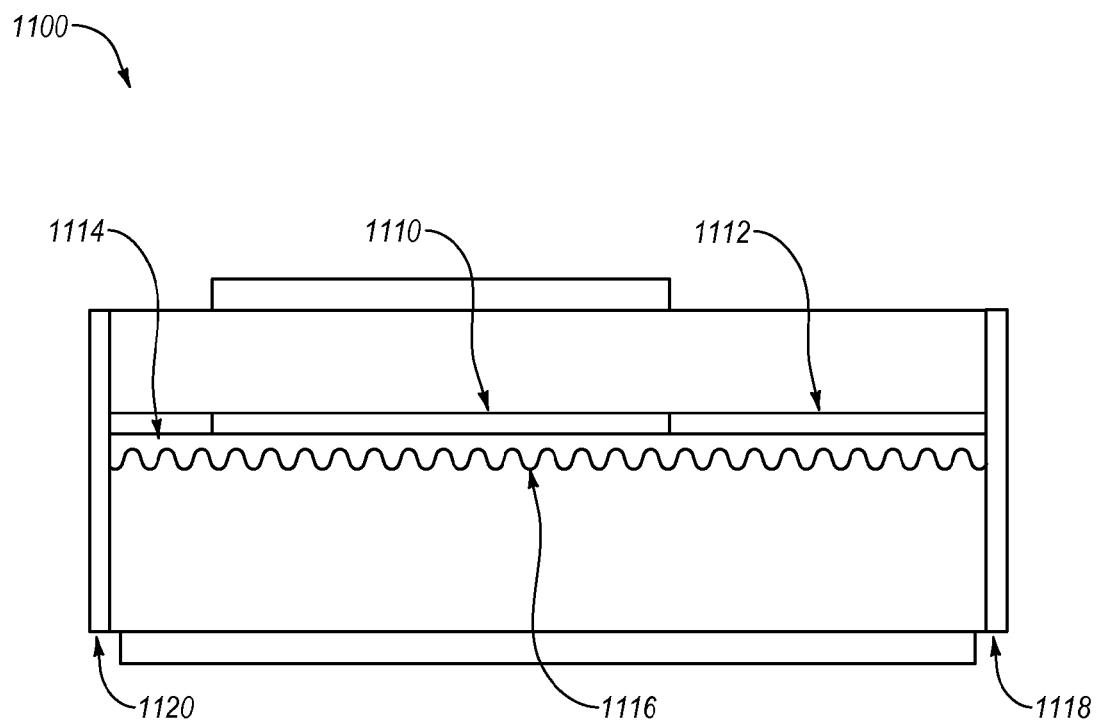
FIG. 11 illustrates an embodiment of a short gain cavity DR laser.
Figure 12A:
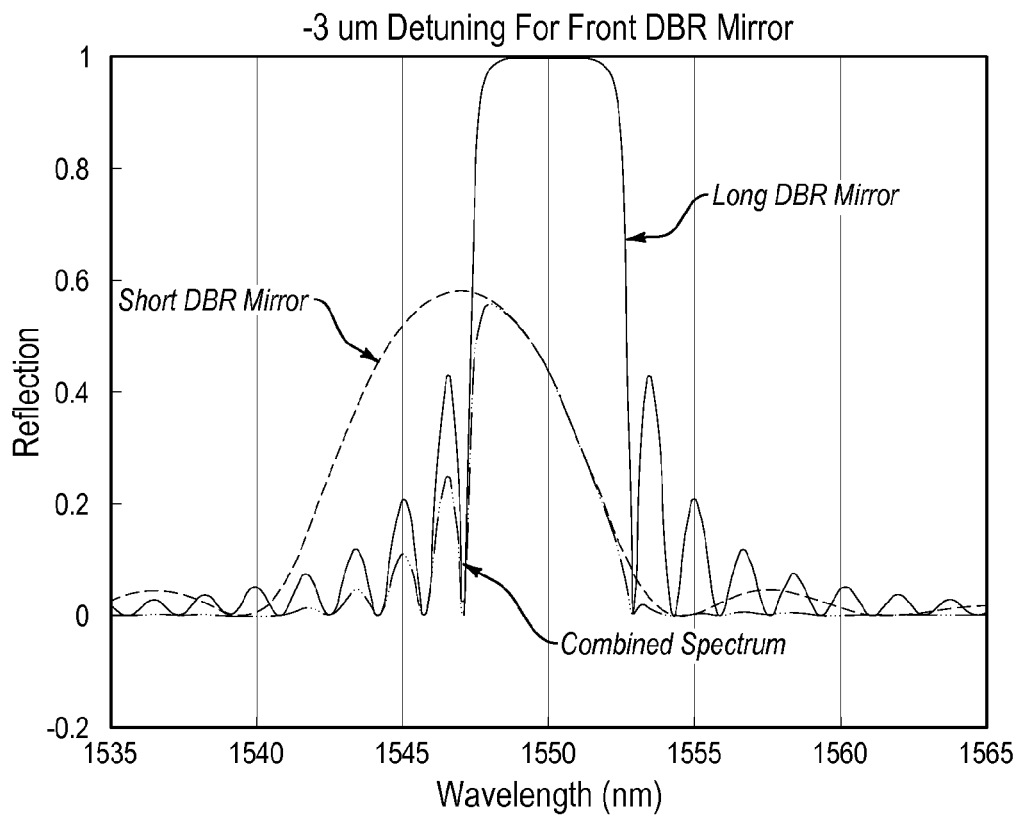
FIG. 12A illustrates reflection versus wavelength spectrum data for the short DBR mirror, long DBR mirror, and a combination spectrum for the DR laser embodiment of FIG. 11.
Figure 12B:
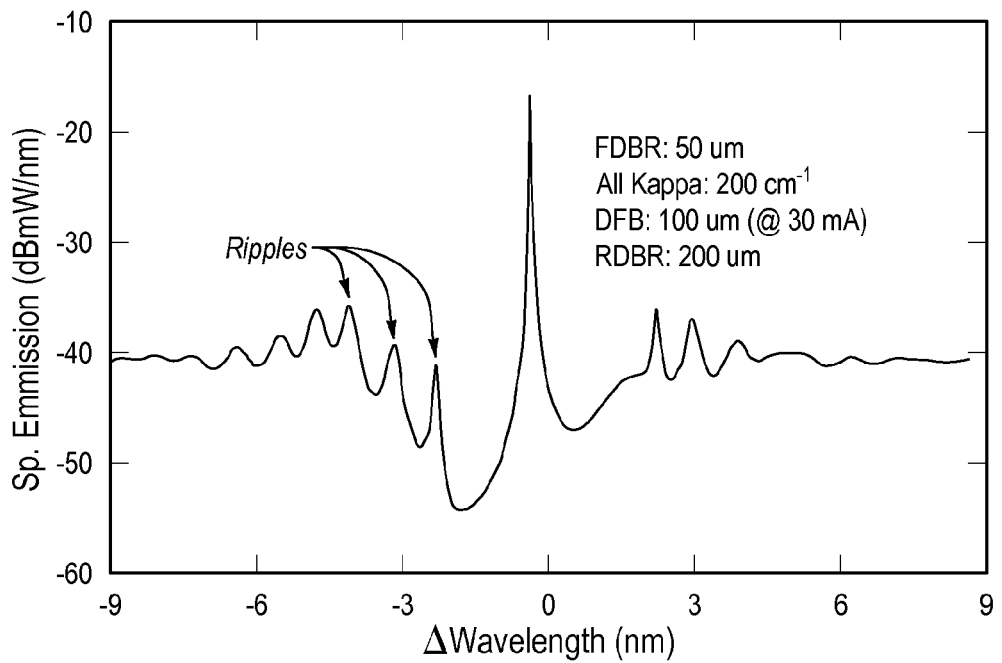
FIG. 12B illustrates spectral emission versus change in wavelength data for the DR laser embodiment of FIG. 11.

FIG. 11 illustrates another embodiment of a laser 1100 configured as a DR laser in accordance with the present invention. The DR laser 1100 includes an active region 1110 configured as a distributed feedback (DFB) gain region, which is flanked on the right by a long DBR mirror 1112 and on the left by a short DBR mirror 1114. However, these flanking sides can be switched. The active region 1110, long DBR mirror 1112, and short DBR mirror 1114 are shown to include a grating 1116. However, the active region 1110 can be devoid of the grating 1116 as described elsewhere herein. The gratings can be the same in all the regions, or they can all be different, or two may have the same grating. The long DBR mirror 1112 includes an anti-reflective coating 1118, and the short DBR mirror 1114 includes an anti-reflective coating 1120, which anti-reflective coatings can be as described herein or known generally in the art. The active region 1110 can be referred to as a gain region, which can be a short gain cavity in accordance with the descriptions provided herein, and it may be configured as a DBF laser active region or gain cavity. The long DBR mirror 1112 has higher reflectivity than the short DBR mirror 1114, and as such a light guide can be coupled to the anti-reflective coating 1120 or facet thereof. Power may also be coupled to the left side of the DR laser.

The DR laser 1100 can be configured as follows: active region 1110 can have a length of 100 microns and operated with 30 mA, long DBR mirror 1112 can have a length of 200 microns, short DBR mirror 1114 can have a length of 50 microns, and the grating 1116 can include a kappa of 200 $cm^{-1}$. Here, the grating has the same kappa throughout. FIGS. 11A-11B show spectrum for this embodiment, which employs the detune loading effect to increase effectiveness of the DR laser 1100. FIG. 11A shows detuning at −3 microns for the short DBR mirror 1114 improves performance. The long DBR mirror 1112 is not detuned, where detuning is optionally or preferably omitted. The short DBR mirror 1114 is shorter in length so that the peak of reflection is lower (e.g., 0.6 or 60% reflectivity) compared to the reflection of the long DBR mirror 1112 (e.g., about 1.0 or about 100% reflectivity). The short DBR mirror 1114 can be detuned to the center, and thereby it is tuned to the shorter side so that there is offset between spectrum for the long DBR mirror 1112 and short DBR mirror 1114. The combined spectrum shows combined reflectivity. FIG. 11B shows the main peak and the left-side ripples that come from the tail of the spectrum of the long DBR mirror 1112, which are also observed in FIG. 11A. The ripples show the detune loading effect spectrum by detuning the short DBR mirror 1114, where FIG. 11B shows lasing spectrum with main peak on the right side of the dip, and the ripples (indicated by arrows) on the left side of the dip. This shows some detuning between short DBR mirror 1114 and long DBR mirror 1112, and thereby lasing on the right side of the dip with detune loading effect. This configuration provides the main mode or main lasing mode and at the center of the graph with lasing at 1550 nm. The data shows lasing on the edge of short DBR mirror 1114 with 1550 wavelength because of the slope of the spectrum, and there is detune loading effect enhancing speed of the laser. Also, FIG. 11B shows that the Fr is enhanced for the offset with −3 micron detuning from the symmetric spectrum; however, −2 micron detuning between short DBR mirror 1114 and long DBR mirror 1112 may also provide a good fit.

Figure 13:
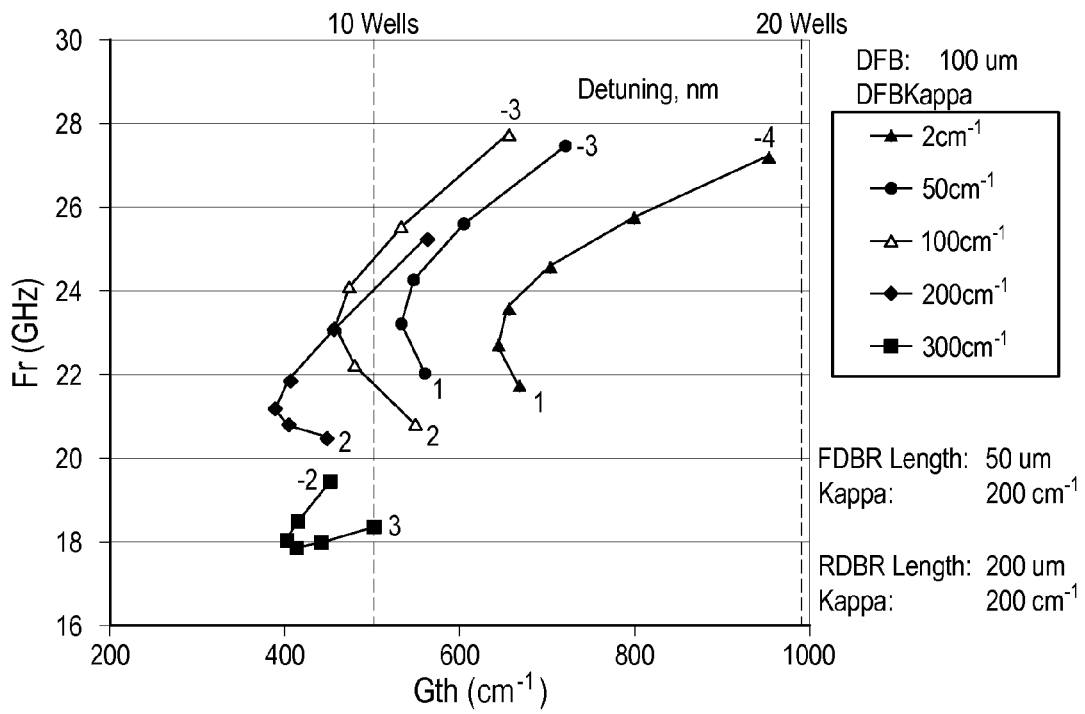
FIG. 13 illustrates Fr versus Gth data for a range of active region kappas for the DR laser embodiment of FIG. 11.
Figure 14:
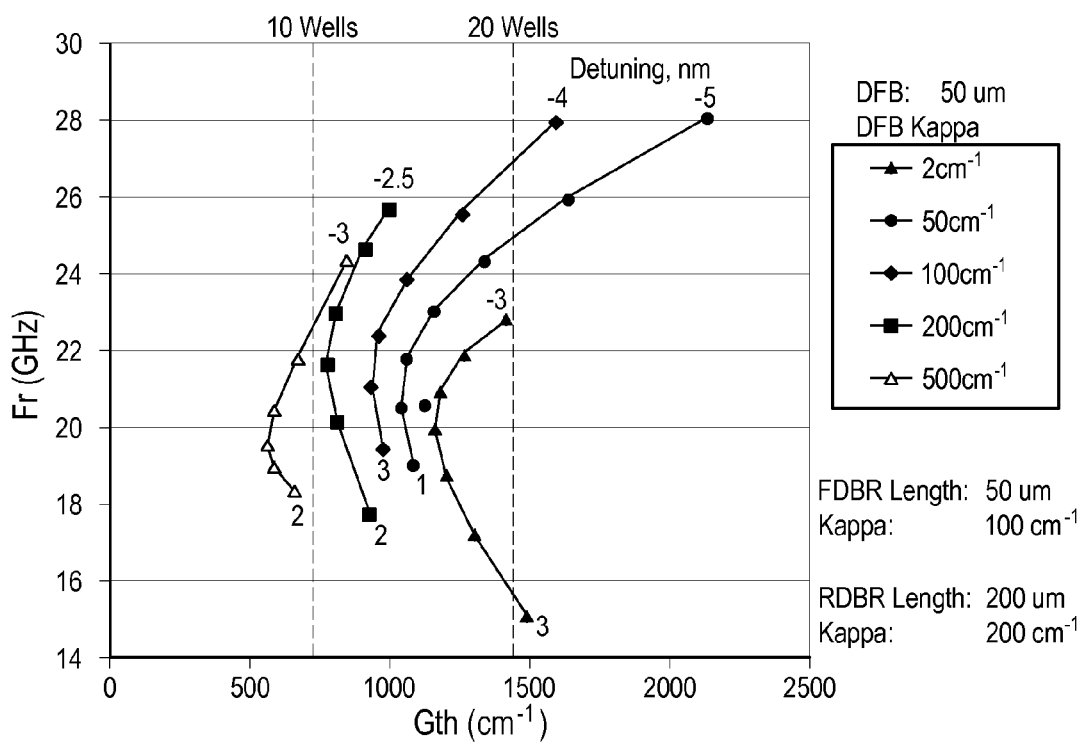
FIG. 14 illustrates Fr versus Gth data for a range of active region kappas for the DR laser embodiment of FIG. 11.

FIG. 13 illustrates the change in the Fr (Ghz) versus Gth ($cm^{-1}$) curves for active region 1110 kappa variations for 2, 50, 100, 200, and 300 $cm^{-1}$ in order to determine optimization of the design parameters for kappa when the active region 1110 has a length of 100 microns, the short DBR mirror 1114 has a length of 50 microns and a kappa of 100 $cm^{-1}$, and the long DBR mirror 1112 has a length of 200 microns with a kappa of 200 $cm^{-1}$. FIG. 14 illustrates the change in the Fr (Ghz) versus Gth ($cm^{-1}$) curves for active region 1110 kappa variations for 2, 50, 100, 200, and 500 $cm^{-1}$ in order to determine optimization of the design parameters for kappa when the active region 1110 has a length of 50 microns, the short DBR mirror 1114 has a length of 50 microns and a kappa of 100 $cm^{-1}$, and the long DBR mirror 1112 has a length of 200 microns with a kappa of 200 $cm^{-1}$. In FIG. 13, the horizontal axis is Gth (cm$^{-1}$), which is loss of cavity, and the laser has the active region 1110 has to overcome this loss of cavity to get lasing (e.g., match with gain). For example, in the middle of FIG. 13 around 500 cm$^{-1}$ there is a dotted vertical line that corresponds with 10 quantum wells for the active region 1110, which illustrates a reasonable loss. This 10 quantum well can overcome 500 cm$^{-1}$ loss, which may be reasonable. If have 20 quantum wells, this design can overcome almost a thousand cm$^{-1}$. As such, depending on the number of quantum wells cavity loss (e.g., about 500 or 1000 cm$^{-1}$) can be determined by the reflectivity of the DBR mirrors. For example, for 50 cm$^{-1}$ kappa there is a number on each sides of the trace (e.g., 1 at the bottom and −3 on the top), which shows detuning in nanometers between the short DBR mirror 1114 and long DBR mirror 1112. Starting from the bottom, this curve initially goes up to the left and Gth gets smaller, and the minimum can correspond with the peak of the short DBR mirror 1112, where there is about zero detuning between the short DBR mirror 1114 and long DBR mirror 1112. Continuing up the trace to the right, there is further detuning up to −3 nm, and loss increases because it is going to the edge of the short DBR mirror and reflectivity goes down. Here, there is a slope of the trace showing that the reflectivity goes down. As such, the loss of cavity increases as Gth goes up and as detuning moves toward −3 nm detuning. If lasing on the peak or long wavelength side of the Bragg mirror then loss of cavity is minimized, as described above.

The vertical axis represents the speed of the laser (e.g., Fr), where for 50 cm$^{-1}$ a +1 detuning is at about 22 GHz, as moving to the peak of Bragg Fr gets better, and if to the negative side of the DBR mirror Fr goes up until −3 detuning where Fr is 28 gigahertz. This shows the detune loading effect enhances Fr. As you move toward the edge of Bragg the Fr goes up to increase speed. As such, there are two things to consider: (1) minimize Gth; and (2) at the same time maximize Fr. The DR laser can be designed with a compromise for optimization between Gth and Fr as shown by FIGS. 13 and 14. In one example of an optimal point, the laser can be designed to maximize Fr to get 28 GHz for the detuning −3 nm with a kappa of 50 cm$^{-1}$. A stronger kappa of 100 cm$^{-1}$ can get about 20 GHz for Fr detuning −3 nm, where threshold gain is around 600 inverse centimeters. Accordingly, it can be reasonable to use 10 to 20 quantum wells +/−5, 4, 3, 2, or 1. The parameters for FIG. 13 show an optimum designed laser: the kappa is different for short and long DBR mirrors for this embodiment; the detuning of the short DBR mirror enhances Fr; a sharper DBR mirror can be better; detuning the long DBR may or may not be performed, and can be omitted; higher kappa for the active region can reduce or terminate the detune loading effect, and lower kappa about 100 cm$^{-1}$; and the number of quantum wells can vary between 12-15 in an optimum embodiment.

FIG. 14 shows the shorter active region 1110 at 50 microns. Again, at the maximum Fr is about 28 GHz, but gain length for active region 1110 is shorter, which results in an increase in the loss of cavity. This shows that a larger number of wells can be beneficial, such as 15-20 wells. The active region 1110 kappa can range from about 100 cm$^{-1}$ to 200 cm$^{-1}$.

In one embodiment, when there is detuning between short DBR mirror 1114 and long DBR mirror 1112, the phase condition can be zero. However, phase condition 90 or 100 degrees can increase Fr more. However, modulating phase condition should avoid mode hop conditions described herein.

Figure 15A:
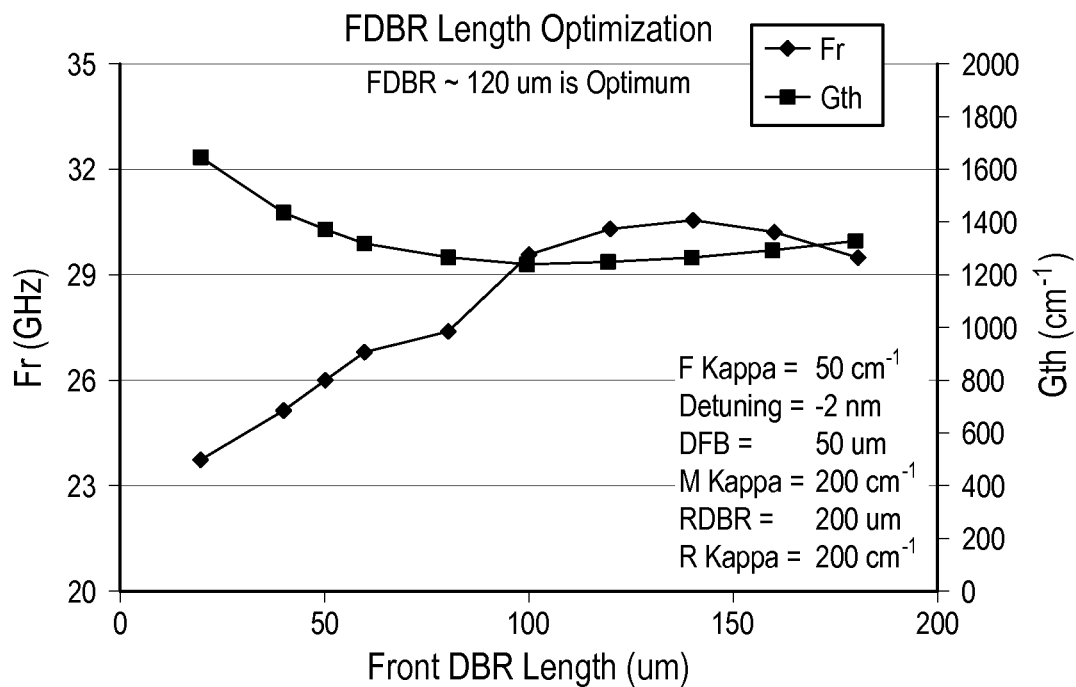
FIG. 15A illustrates Fr optimization by varying length of the short DBR laser of the DR laser embodiment of FIG. 11.
Figure 15B:
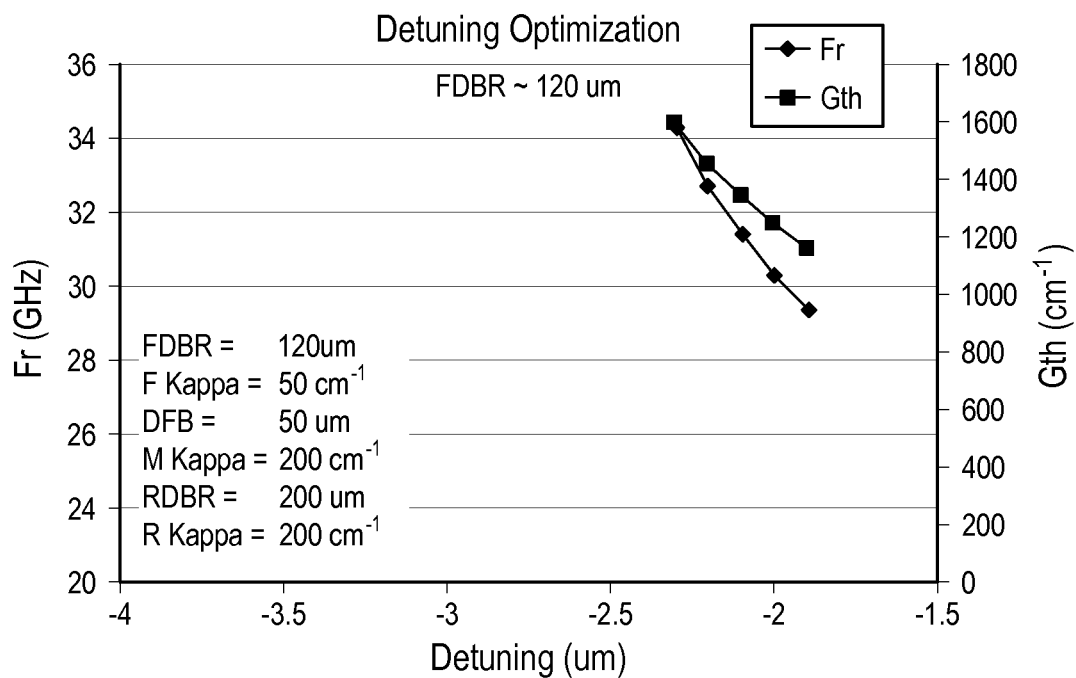
FIG. 15B illustrates Fr optimization by varying detuning of the short DBR laser of the DR laser embodiment of FIG. 11.

FIGS. 15A-15B includes data from a laser 1100 having an active region 1110 (e.g., DBF) with a length of 50 microns and kappa of 200 cm$^{-1}$ (¼ shifted) with a 30 mA bias, a front DBR mirror (e.g., equivalent position to short DBR mirror 1114) length ranging as shown in FIG. 15A with a kappa about 50 cm$^{-1}$ and detuning about −2 nm, and long DBR mirror 1112 length of 200 microns with a kappa of 200 cm$^{-1}$. The short DBR mirror can be about 120 microns detuned about −2 nm, which can results in a 50% increase in Fr to obtain 34 GHz. However, loss of cavity may increase. This embodiment can be optimized with about 20 wells +/−5, 4, 3, 2, or 1 wells.

Figure 16A:
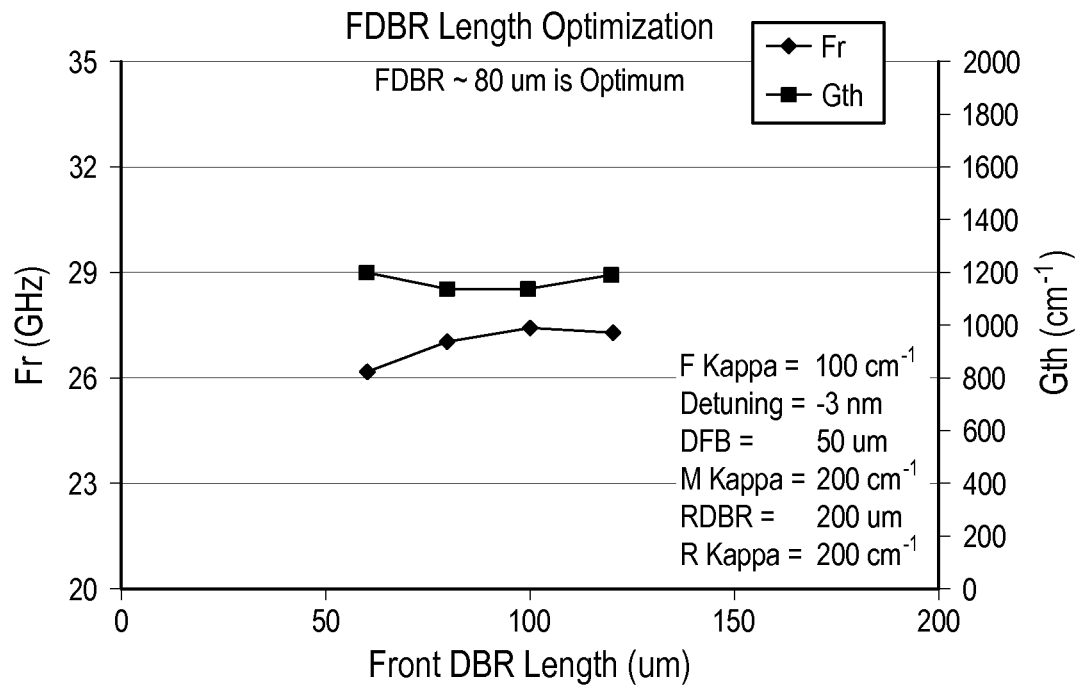
FIG. 16A illustrates Fr optimization by varying length of the short DBR laser of the DR laser embodiment of FIG. 11.
Figure 16B:
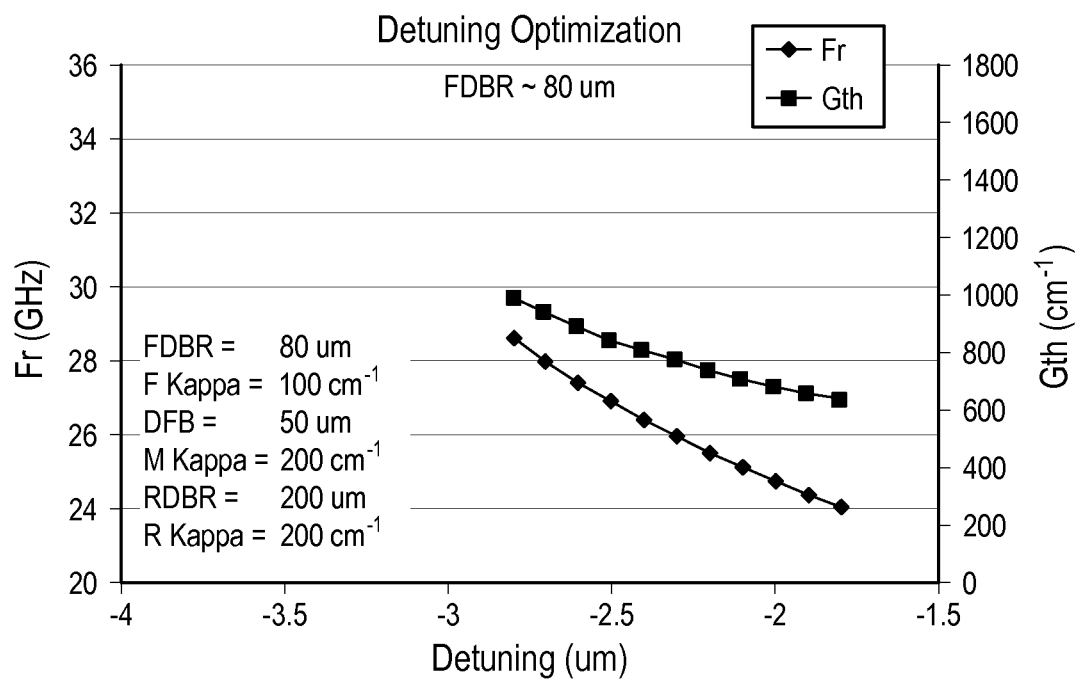
FIG. 16B illustrates Fr optimization by varying detuning of the short DBR laser of the DR laser embodiment of FIG. 11.

FIGS. 16A-16B includes data from a laser 1100 having an active region 1110 (e.g., DBF) with a length of 50 microns and kappa of 200 cm$^{-1}$ (¼ shifted) with a 30 mA bias, a front DBR mirror (e.g., equivalent position to short DBR mirror 1114) length ranging as shown in FIG. 16A with a kappa about 100 cm$^{-1}$ and detuning about −3 nm, and long DBR mirror 1112 length of 200 microns with a kappa of 200 cm$^{-1}$. The data shows that the short DBR mirror can be about 80 microns detuned about −3 nm, which can results in an increase in Fr to about 30 GHz (e.g., 28 GHz). This embodiment can be optimized with about 10 wells +/−3, 2, or 1 wells.

Figure 17A:
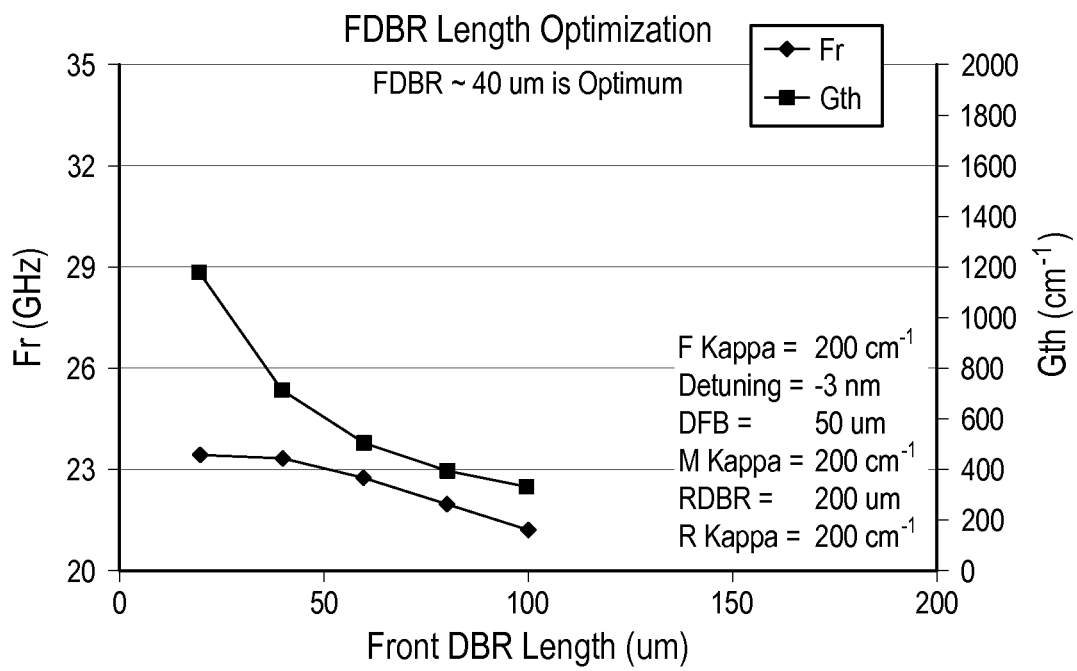
FIG. 17A illustrates Fr optimization by varying length of the short DBR laser of the DR laser embodiment of FIG. 11.
Figure 17B:
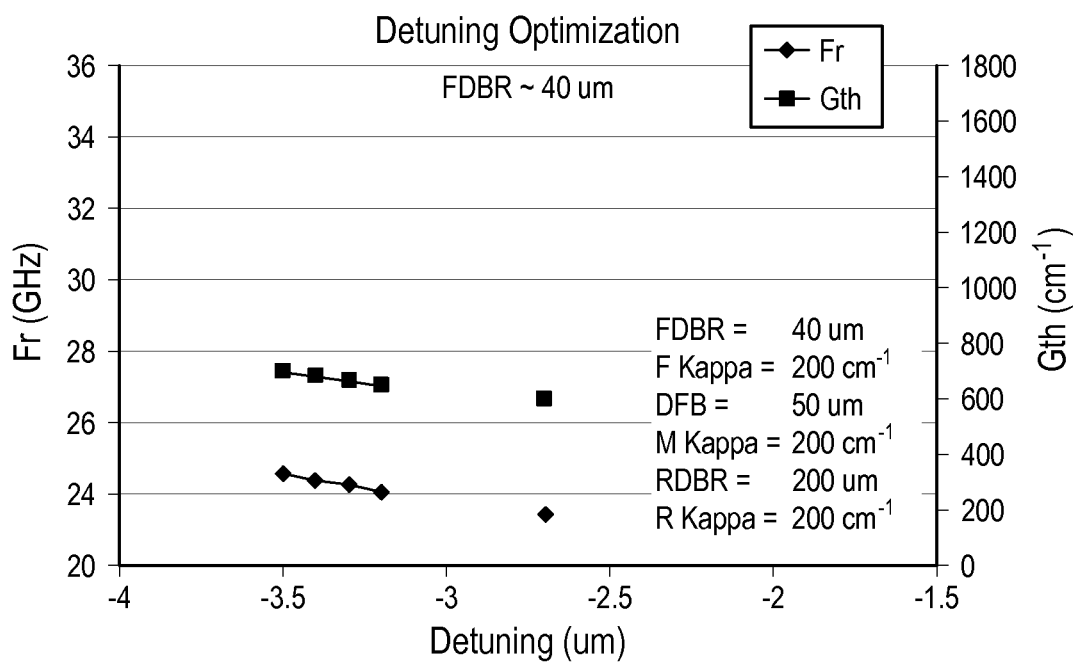
FIG. 17B illustrates Fr optimization by varying detuning of the short DBR laser of the DR laser embodiment of FIG. 11.

FIGS. 17A-17B includes data from a laser 1100 having an active region 1110 (e.g., DBF) with a length of 50 microns and kappa of 200 cm$^{-1}$ (¼ shifted) with a 30 mA bias, a front DBR mirror (e.g., equivalent position to short DBR mirror 1114) length ranging as shown in FIG. 17A with a kappa about 200 cm$^{-1}$ and detuning about −3 nm, and long DBR mirror 1112 length of 200 microns with a kappa of 200 cm$^{-1}$. The data shows that the short DBR mirror can be about 40 microns detuned about −3 nm, which can results in an increase in Fr to about 30 GHz (e.g., 29 GHz). This embodiment can be optimized with about 8 wells +/−2 or 1 wells.

Accordingly, the DR laser can include an active region (e.g., DBF) with a length of 50 microns and kappa of 200 cm$^{-1}$ (¼ shifted) with a 30 mA bias, a front DBR mirror (e.g., equivalent position to short DBR mirror) length ranging from 40 microns to 120 micros with a kappa ranging from about 50 to 200 cm$^{-1}$ and detuning about −2 or −3 nm, and long DBR mirror length of 200 microns with a kappa of 200 cm$^{-1}$. Here, when the short DBR mirror has a kappa that is low or about 50 cm$^{-1}$ the length is longer such as 120 nm, and when the kappa is high or about 200 cm$^{-1}$ the length is shorter such as 40 micron. As such, the detune loading effect can be achieved by varying the short DBR mirror inversely compared to the kappa. Also, the detuning can change from −2 for small lower kappa of 50 cm$^{-1}$ to −3 for the higher kappa of 200 cm$^{-1}$. This can be used in DR laser design and manufacturing, and be included in the DR laser devices.

In accordance with the DR laser embodiment, the active region or gain cavity can have a length from about 10 microns to about 150 microns, preferably from about 15 microns to about 100 microns, more preferably from about 20 microns to about 75 microns, even more preferably from about 25 microns to about 50 microns, or most preferably about 30 microns to 40 microns, or about 35 microns or less than 50 microns. Alternatively, the active region or gain cavity can have a length from about 10 microns to about 50 microns, preferably from about 15 microns to about 40 microns, more preferably from about 20 microns to about 35 microns, or most preferably about 25 microns to 30 microns.

In accordance with the DR laser embodiment, the active region or gain cavity can include one or more quantum wells. Any number of quantum wells that is reasonable may be used, such as up to 20 as shown experimentally. The quantum wells may be separated by one or more quantum well barriers as known in the art. The quantum wells are prepared from traditional quantum well materials for DFB active regions.

In accordance with the DR laser embodiment, the long DBR region can have a length from about 100 microns to about 300 microns, preferably from about 150 microns to about 250 microns, more preferably from about 175 microns to about 225 microns, or most preferably from about 190 microns to about 210 microns, or about 200 microns.

In accordance with the DR laser embodiment, the active region and/or long DBR mirror has a kappa from about 150 $cm^{-1}$ to about 500 $cm^{-1}$ (or higher if possible), preferably from about 200 $cm^{-1}$ to about 475 $cm^{-1}$, more preferably from about 300 $cm^{-1}$ to about 450 $cm^{-1}$, or most preferably from about 350 cm to about 325 $cm^{-1}$, or about 400 $cm^{-1}$. Up to 600 $cm^{-1}$ may be feasible and desirable. In one aspect, the long DBR region has a kappa of at least about 200 $cm^{-1}$. The active region kappa can be ¼ shifted from the long DBR mirror In accordance with the DR laser embodiment, the short DBR region can have a length from about 30 microns to about 130 microns, from about 40 microns to about 120 microns, from about 50 microns to about 100 microns, or from about 60 microns to about 90 microns, or about 80 microns. The length can be optimized in view of the other parameters as per the FIGS. 15A-15B, 16A-16B, and 17A-17B.

In accordance with the DR laser embodiment, the short DBR region has a kappa from about 25 $cm^{-1}$ to about 300 $cm^{-1}$ (or higher if possible), from about 50 $cm^{-1}$ to about 200 $cm^{-1}$, from about 75 $cm^{-1}$ to about 150 $cm^{-1}$, or from about 100 $cm^{-1}$ to about 125 $cm^{-1}$, or about 100 $cm^{-1}$. In one aspect, the long DBR region has a kappa of about 50, 100, or 200 $cm^{-1}$.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A single mode laser comprising:
    a gain cavity having a length from about 10 microns to about 150 microns;
    a distributed Bragg reflector ("DBR") region having a grating with a corrugation depth kappa of at least about 200 $cm^{-1}$;
    a gap region between the gain cavity and DBR region having a gap length that is less than about 30 microns; and
    a single lasing mode at a long wavelength side of a Bragg peak of the DBR region.

2. The laser of claim 1, wherein the lasing on the long wavelength side of the Bragg peak results from a detune of from about −2 to about −3 nm.

3. The laser of claim 1, wherein the gain cavity has a length of less than or about 50 microns and is devoid of a grating.

4. The laser of claim 1, comprising:
    the DBR region having a length of greater than 150 microns; and
    a second DBR region adjacent to the gain cavity and opposite of the DBR region, wherein the second DBR region has a length from about 40 microns to about 120 microns and a kappa ranging from 50 cm−1 when the length is about 120 microns to about 200 cm−1 when the length is about 40 microns.

5. The laser of claim 1, wherein the gain cavity is between about 15 and about 100 microns.

6. The laser of claim 1, wherein the gain cavity is between about 20 and about 75 microns.

7. The laser of claim 1, the DBR region having a length of greater than 150 microns; and
    a second DBR region adjacent to the gain cavity and opposite of the DBR region, wherein the second DBR region has a length and kappa both being less than the length and kappa of the first DBR region.

8. The laser of claim 7, wherein the active region includes a corrugation depth kappa.

9. The laser of claim 8, wherein the kappa of the active region is the same as the kappa for the first DBR region.

10. The laser of claim 8, wherein the active region has between 10 to 20 quantum wells.

11. The laser of claim 7, comprising detuning between the first DBR region and second DBR region.

12. The laser of claim 7, wherein the kappa of the active region is phase shifted.

13. The laser of claim 12, wherein the kappa of the active region is ¼ shifted.

14. The laser of claim 1, the gap having an isolation structure with about 50 mega ohm insulation.

15. A method of designing a single mode laser, comprising:
    determining a gain cavity to have a length of less than or about 150 microns;
    determining a distributed Bragg reflector ("DBR") region to have a grating with a corrugation depth kappa of at least about 200 $cm^{-1}$;
    determining a gap region between the gain cavity and DBR region having a gap length that is less than about 30 microns; and
    determining a single lasing mode at a long wavelength side of a Bragg peak of the DBR region.

16. The method of claim 15, comprising configuring the lasing mode to be on long wavelength side of the Bragg peak utilizing a detune loading effect.

17. The method of claim 16, comprising determining the laser to have one or more of the following parameters:
    gain cavity has a length of less than or about 50 microns and is devoid of a grating;
    the kappa is at least about 200 $cm^{-1}$;
    a reflective fact having at least about 95% reflectivity adjacent to the gain cavity and opposite of the DBR region or a second DBR region adjacent to the gain cavity and opposite of the DBR region;
    an open eye at about 10 Gb with 3.5 mA bias current and 4 mApp modulation current;
    about 25 GHz bandwidth;
    power for lasing is less than about 1.5 W;
    modulation voltage is less than about 6 Vpp;
    speed of at least about 25 Gbps;
    stop band width of about 5 nm;
    linewidth of below about 400 KHz;
    side mode suppression ratio of about 68 dB; or
    a L-I curve that is superlinear with a mode hop at about 45 mA.

18. The method of claim 16, comprising determining the laser to have the following parameters:
    the DBR region having a length of greater than 150 microns; and
    a second DBR region adjacent to the gain cavity and opposite of the DBR region, wherein the second DBR region has a length from about 40 microns to about 120 microns and a kappa ranging from 50 cm−1 when the length is about 120 microns to about 200 cm−1 when the length is about 40 microns.

19. The method of claim 15, comprising determining an insolation structure for the gap to have about 50 mega ohm insulation.

20. A method of manufacturing a single mode laser, comprising:
- preparing a gain cavity to have a length of less than or about 150 microns;
- preparing a distributed Bragg reflector ("DBR") region to have a grating with a corrugation depth kappa of at least about 200 cm$^{-1}$;
- preparing a gap region between the gain cavity and DBR region having a gap length that is less than about 30 microns; and
- tuning a single lasing mode at a long wavelength side of a Bragg peak of the DBR region.

21. The method of claim 20, comprising tuning the lasing mode to be on long wavelength side of the Bragg peak utilizing a detune loading effect.

22. The method of claim 21, comprising preparing the laser to have one or more of the following parameters:
- gain cavity has a length of less than or about 50 microns and is devoid of a grating;
- a gap region between the gain cavity and DBR region having a gap length that is less than about 30 microns or a gap region adjacent to the gain cavity having a gap length that is less than the length of the gain cavity;
- the kappa is at least about 200 cm$^{-1}$;
- a reflective fact having at least about 95% reflectivity adjacent to the gain cavity and opposite of the DBR region or a second DBR region adjacent to the gain cavity and opposite of the DBR region;
- an open eye at about 10 Gb with 3.5 mA bias current and 4 mApp modulation current;
- about 25 GHz bandwidth;
- power for lasing is less than about 1.5 W; modulation voltage is less than about 6 Vpp;
- speed of at least about 25 Gbps;
- stop band width of about 5 nm;
- linewidth of below about 400 KHz;
- side mode suppression ratio of about 68 dB; or
- a L-I curve that is superlinear with a mode hop at about 45 mA.

23. The method of claim 21, comprising preparing the laser to have the following parameters:
- the DBR region having a length of greater than 150 microns; and
- a second DBR region adjacent to the gain cavity and opposite of the DBR region, wherein the second DBR region has a length from about 40 microns to about 120 microns and a kappa ranging from 50 cm−1 when the length is about 120 microns to about 200 cm−1 when the length is about 40 microns.

24. The method of claim 20, comprising forming an insolation structure in the gap to have about 50 mega ohm insulation.

* * * * *

UNITED STATES PATENT AND TRADEMARK OFFICE
CERTIFICATE OF CORRECTION

PATENT NO. : 9,048,618 B2
APPLICATION NO. : 13/795384
DATED : June 2, 2015
INVENTOR(S) : Yasuhiro Matsui Page 1 of 1

It is certified that error appears in the above-identified patent and that said Letters Patent is hereby corrected as shown below:

In The Specification

In Column 5, Line 4, delete "MQM" and insert -- MQW --

In Column 12, Line 67, delete "Mach-Zender" and insert -- Mach-Zehnder --

Signed and Sealed this
Third Day of May, 2016

Michelle K. Lee
*Director of the United States Patent and Trademark Office*